(12) United States Patent
Tsuda

(10) Patent No.: US 6,342,329 B1
(45) Date of Patent: Jan. 29, 2002

(54) IMAGE-FORMING MEDIUM

(75) Inventor: Masashi Tsuda, Aichi-ken (JP)

(73) Assignee: Brother Kogyo Kabushiki Kaisha, Nagoya (JP)

( * ) Notice: Subject to any disclaimer, the term of this patent is extended or adjusted under 35 U.S.C. 154(b) by 0 days.

(21) Appl. No.: 09/228,762

(22) Filed: Jan. 12, 1999

(30) Foreign Application Priority Data

Jan. 16, 1998 (JP) ............................................. 10-020303

(51) Int. Cl.$^7$ .................................................. G03C 1/72
(52) U.S. Cl. ...................... 430/138; 430/926; 430/340; 430/281.1
(58) Field of Search ................. 430/138, 926, 430/340, 281.1, 913, 915, 919, 922, 923

(56) References Cited

U.S. PATENT DOCUMENTS

| | | | |
|---|---|---|---|
| 2,800,457 A | 7/1957 | Green et al. | |
| 2,800,458 A | 7/1957 | Green | |
| 4,001,140 A | 1/1977 | Foris et al. | |
| 4,087,376 A | 5/1978 | Foris et al. | |
| 4,089,802 A | 5/1978 | Foris et al. | |
| 4,276,364 A | * 6/1981 | Leone | 430/212 |
| 4,842,976 A | * 6/1989 | Sanders et al. | 430/138 |
| 4,977,511 A | * 12/1990 | Gottschalk et al. | 430/927 |
| 4,987,064 A | * 1/1991 | Saitou et al. | 430/570 |
| 4,997,745 A | * 3/1991 | Kawamura et al. | 430/281 |
| 5,034,302 A | 7/1991 | Adair et al. | |
| 5,053,309 A | * 10/1991 | Sanders et al. | 430/138 |
| 5,079,626 A | 1/1992 | Ohashi | |
| 5,100,756 A | * 3/1992 | Kobayashi | 430/138 |

FOREIGN PATENT DOCUMENTS

| | | |
|---|---|---|
| EP | 0 339 841 A2 | 11/1989 |
| GB | 952-807 | 3/1964 |
| GB | 965-074 | 7/1964 |
| JP | 36-9168 | 5/1934 |
| JP | 38-19574 | 11/1936 |
| JP | 42-446 | 1/1942 |
| JP | 42-771 | 1/1942 |
| JP | 51-9079 | 3/1975 |
| JP | A-55-15681 | 2/1980 |
| JP | A-56-100630 | 8/1981 |
| JP | A-57-110332 | 7/1982 |
| JP | A-57-116010 | 7/1982 |
| JP | A-2-82234 | 3/1990 |
| JP | 2082234 | * 3/1990 |

* cited by examiner

*Primary Examiner*—Janet Baxter
*Assistant Examiner*—Yvette M. Clarke
(74) *Attorney, Agent, or Firm*—Oliff & Berridge, PLC

(57) ABSTRACT

An image-forming medium comprises a substrate and several types of photo-curing compositions with sensitivity peaks in different wavelength regions supported thereon. Each of the several types of photocuring compositions contains a spectral sensitizer which is designed so that there is apparently no crosstalk in an image which is formed using the image-forming medium.

18 Claims, 26 Drawing Sheets

3-Ethyl-5-(1-methylnaphth [1,2-d] oxazol-2(1H)-ylidene)-2-thioxo-4-thiazolidinone 3-Ethyl-2-[(3-ethyl-2(3H)-benzothiazolylidene)methyl] benzothiazolium iodide 5-Chloro-2-[[(5-chloro-3-(3-sulfopropyl)-2(3H)-benzothiazolylidene] methyl]-3-(3-sulfopropyl) benzothiazolium hydroxide, inner salt, sodium salt 2,3,6,7-Tetrahydro-11-oxo-1H,5H,11H-[1]benzopyrano[6,7,8-ij]quinolizine-10-carboxylic acid, ethyl ester Fig.6 3-Ethyl-2-[3-(3-ethyl-2-thiazolidinylidene)-1-propenyl]-4,5-dihydrothiazolium iodide 3-Ethyl-2-[3-(3-ethyl-2(3H)-benzothiazolylidene)-2-methyl-1-propenyl] benzothiazolium iodide 5-Chloro-2-[3-[5-chloro-3-(3-sulfopropyl)-2(3H)-benzothiazolylidene]-2-methyl-1-propenyl]-3-(3-sulfopropyl)benzothiazolium hydroxide, inner salt, compd. with triethylamine 3-Ethyl-2-[3-(3-ethyl-2(3H)-benzothiazolylidene)-1-propenyl]benzothiazolium iodide 5-Chloro-2- [3- [5-chloro-3-(4-sulfobutyl)-2(3H)-benzothiazolylidene] -1-propenyl] -3-(4-sulfobutyl) benzothiazolium hydroxide, inner salt, compd. with triethylamine 3-Ethyl-2-[5-(3-ethyl-2(3H)-benzothiazolylidene)-1,3-pentadienyl] benzothiazolium iodide Fig.16 2-[3-[[3-Ethyl-2(3H)-benzothiazolylidene)methyl]-5,5-dimethyl-2-cyclohexen-1-ylidene]methyl]-3-(3-sulfopropyl) benzothiazolium hydroxide, inner salt 3-Ethyl-2-[[3-[[(3-ethyl-2(3H)-benzothiazolylidene)methyl]]-5,5-dimethyl-2-cyclohexen-1-ylidene]methyl]benzothiazolium iodide 3-Ethyl-2-[[3-ethyl-5-[[2-(1-ethyl-4(1H)-quinolinylidene)ethylidene]-4-oxo-2-thiazolidinylidene]methyl]benzoxazolium bromide 3-Ethyl-2-[5-(3-ethyl-2(3H)-benzoselenazolylidene)-1,3-pentadienyl] benzoselenazolium iodide 2-[[3-[(5,6-Dimethyl-3-phenethyl-2(3H)-benzothiazolylidene)methyl]-5,5-dimethyl-2-cyclohexen-1-ylidene]methyl]-3-(3-sulfopropyl) naphtho[2,1-d]thiazolium hydroxide, inner salt

IMAGE-FORMING MEDIUM

BACKGROUND OF THE INVENTION

1. Field of the Invention

The present invention relates to an image-forming medium used in image-forming apparatuses such as printers, etc.

2. Description of the Related Art

An image-forming apparatus with the following type of structure is used for practical purposes.

In this image-forming apparatus, first, an image-forming medium in a sheet form that has been coated with microcapsules in which a dye precursor and a photocuring composition have been encapsulated is exposed to light according to image data by using an exposure means and the photocuring composition inside the microcapsules is cured according to the image data.

Then, ordinary paper, etc., that has been coated with a developer that will change colors when it reacts with the dye precursor encapsulated in the microcapsules, etc., and a photosensitive sheet that has been exposed are made to come in contact therewith and are pressed to perform a development, the microcapsules that have not been cured are broken with a crushing roller, and an image is formed when the dye precursor that flows out of the microcapsules reacts with the developer.

This image-forming apparatus uses an image-forming medium in which 3 types of microcapsules, which are shown below, are supported on a film, and once the medium has been exposed to light in accordance with image data, the medium is overlapped with an image-receiving sheet that has been coated with a developer and pressed and developed in this state.

The microcapsules in the uncured part are broken when they are pressed. The colorless dye flows out therefrom and reacts with the developer and coloration takes place to form an image. The exposure means is an analog exposure system, in which a pattern sheet transmits or reflects light and exposure is performed all at once with image data light of a wavelength of from blue to red (approximately 400 to 700 nm)

(1) Microcapsules encapsulating a photocuring composition sensitive to light of the blue wavelength region and a colorless dye that turns yellow when it reacts with developer.

(2) Microcapsules encapsulating a photocuring composition sensitive to light of the green wavelength region and a colorless dye that turns magenta when it reacts with developer.

(3) Microcapsules encapsulating a photocuring composition sensitive to light of the red wavelength region and a colorless dye that turns cyan when it reacts with developer.

Nevertheless, the image-forming medium used in conventional image-forming apparatuses poses a problem in that, when the medium is exposed in succession by using image data light of the blue (approximately 400 to 500 nm), green (approximately 500 to 600 nm), and red (approximately 600 to 700 n) wavelength regions, there is a reduction in the density of the 3 primary colors of yellow, magenta and cyan.

This problem is caused by so-called crosstalk at the photosensitive wavelength region of the microcapsules, That is, the photosensitivity of each microcapsule used in the conventional image-forming medium is as shown in FIG. 26. For instance, microcapsules for magenta coloration are desired to be photosensitive to only light of the green wavelength region (approximately 500 to 600 nm).

However, as shown in FIG. 26, since microcapsules for magenta coloration are sensitive to light of from approximately 430 nm to approximately 640 nm, they are also photosensitive to light of the blue wavelength region (approximately 400 to 500 nm), etc.

Therefore, it appears that when light that has been resolved to the 3 colors of blue, green, and red is used for exposure, a curing reaction proceeds with exposure to light other than green light, to which the microcapsules should not be originally sensitive, and this leads to a reduction in the density of the 3 primary colors.

This type of overlapping of wavelength regions where there is photosensitivity is called crosstalk.

In order to solve this problem with crosstalk, the digital image-forming apparatus of Japanese Patent Application Laid-open No. 2-82234 has a means for irradiating light that does not reach the crosstalk wavelength region of microcapsule sensitivity, as the digital image data light, onto an image-forming medium coated with 3 types of microcapsules having a sensitivity peak in the respective wavelength regions of blue, green, and red.

A combination of a halogen tungsten lamp and color filter is used, or a metal halide lamp with an emission spectrum at a specific wavelength is used, in the above-mentioned publications in order to prevent crosstalk.

Nevertheless, there are many cases when the crosstalk wavelength region of actual microcapsules is broad as shown in FIG. 1, and if light that does not reach crosstalk is to be used with microcapsules for magenta coloration that are photosensitive to green, in particular, this light will be very limited at 540 to 580 nm, and it will be difficult to actually make this type of light using a color filter.

Moreover, although it is possible to emit light of a certain single wavelength using a metal halide lamp, realistically, it is difficult to use metal halide lamps in printers, etc., because they are expensive and they require large amounts of energy.

SUMMARY OF THE INVENTION

The present invention has solved the above-mentioned problems, its object is to provide an image-forming medium with no reduction in image density, even though exposure is performed using light that has been resolved by a simple, inexpensive device such an a filter, etc.

In order to accomplish this object, the present invention provides an image-forming medium comprising a substrate and several types of photo-curing compositions with sensitivity peaks in different wavelength regions supported thereon. Each of the several types of photocuring compositions contains a spectral sensitizer that is designed so that there is apparently no crosstalk in an image which is formed using the image-forming medium.

The "apparently" used here means that crosstalk is controlled to such an extent that there is no reduction in image density, even when exposure is performed with light that has been resolved to 3 colors.

Using the best sensitivity as the criterion, crosstalk is actually present when sensitivity in 1/1,000 or 1/10.000 the best sensitivity.

However, crosstalk at a sensitivity that differs by even 3 to 4 digits essentially has no effect an the image. It, therefore, is quite possible to apparently eliminate crosstalk to such an extent that there will be no problems with the image, although it is difficult to completely eliminate crosstalk of a photocuring composition.

In the image-forming medium of the present invention, each of the above-mentioned several types of photocuring compositions contains a spectral sensitizer, which is designed so that there will be apparently no crosstalk in the image that has been formed using the image-forming medium. Therefore, even if exposure in performed using light that has been resolved by a simple, inexpensive device such as a filter, etc., a reduction in image optical density (hereinafter merely referred to as "image density") can realistically be prevented.

In the image-forming medium of the present invention, it is preferable that the half-width of the wavelength absorption peak of each spectral sensitizer of the image-forming medium is 50 nm or less, so that crosstalk is hardly present and a reduction in image density can realistically be prevented.

Moreover, in the image-forming medium of the present invention, it is preferable that 3 types of photocuring compositions are supported on a substrate in the image-forming medium, and that spectral sensitizer with a maximum absorption wavelength in the blue, green, or red wavelength regions is contained in the respective photocuring composition, so that full-color printing is possible and a reduction in density of the 3 primary colors can be prevented.

In addition, in the image-forming medium of the present invention, it is preferable that the spectral sensitizers contained in the image-forming medium have a maximum absorption wavelength of 400 to 470 nm, 530 to 570 nm, or 630 to 700 nm, respectively, so that a reduction in density of the 3 primary colors can be reliably prevented.

Moreover, in the image-forming medium of the present invention, it is preferable that the photocuring compositions are supported on a substrate in a microcapsule-encapsulated state, so that it is possible to provide an inexpensive image-forming medium with which full-color printing is possible and a reduction in density of the 3 primary colors, etc., can be prevented using microcapsules that can be easily produced by conventional methods.

This and other objects, features and advantages of the present invention are described in or will become apparent from the following detailed description of the invention.

BRIEF DESCRIPTION OF THE DRAWINGS

Each of FIGS. 1 to 6 is a graph showing the correlation between absorbance and wavelength in the spectral sensitizer having sensitivity to light of the blue wavelength region.

Each of FIGS. 7 to 14 is a graph showing the correlation between absorbance and wavelength in the spectral sensitizer having sensitivity to light of the green wavelength region.

Each of FIGS. 15 to 24 is a graph showing the correlation between absorbance and wavelenght in the spectral sensitizer having sensitivity to light of the red wavelength region and the spectral sensitizer.

Figure 1:
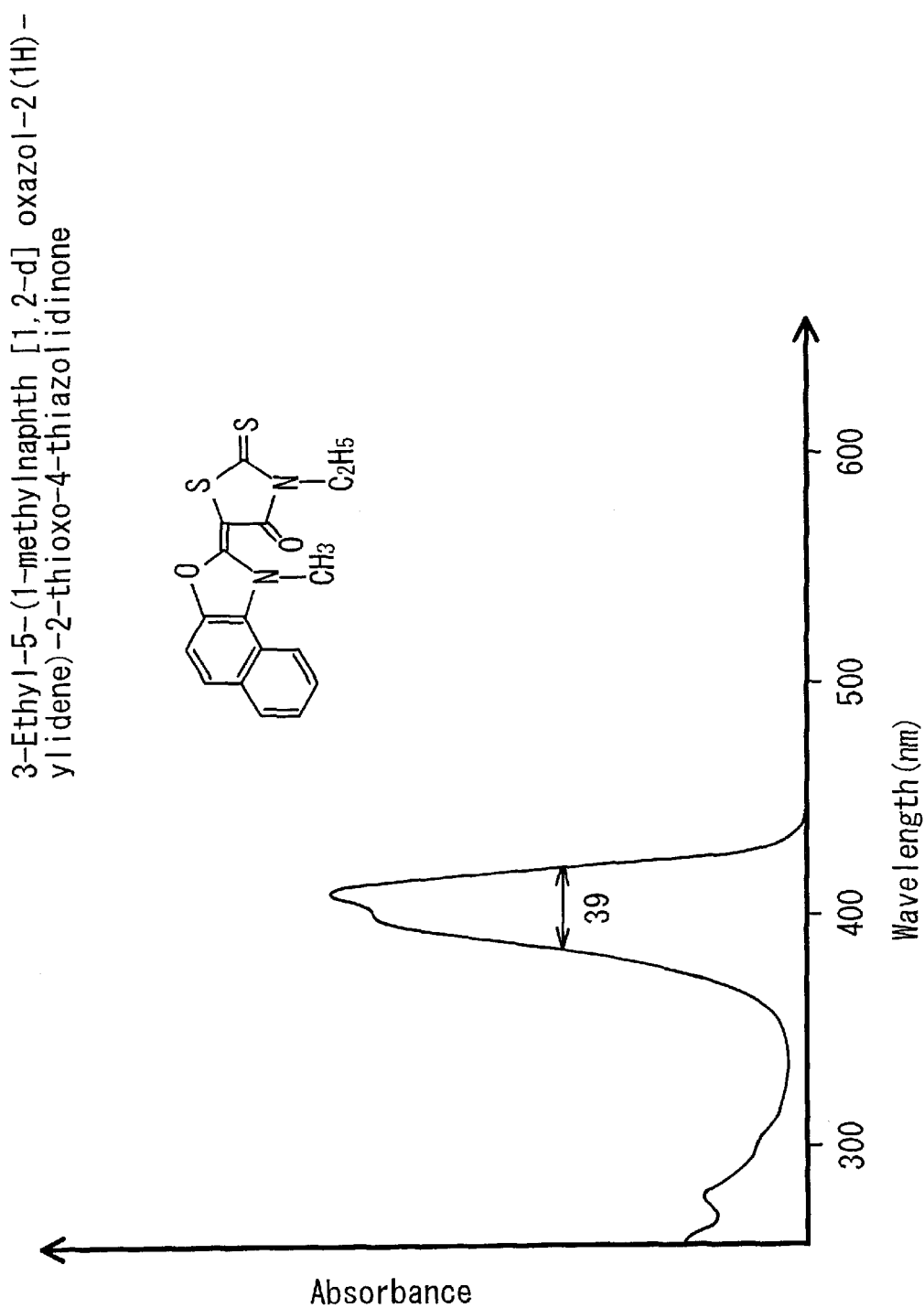
Figure 2:
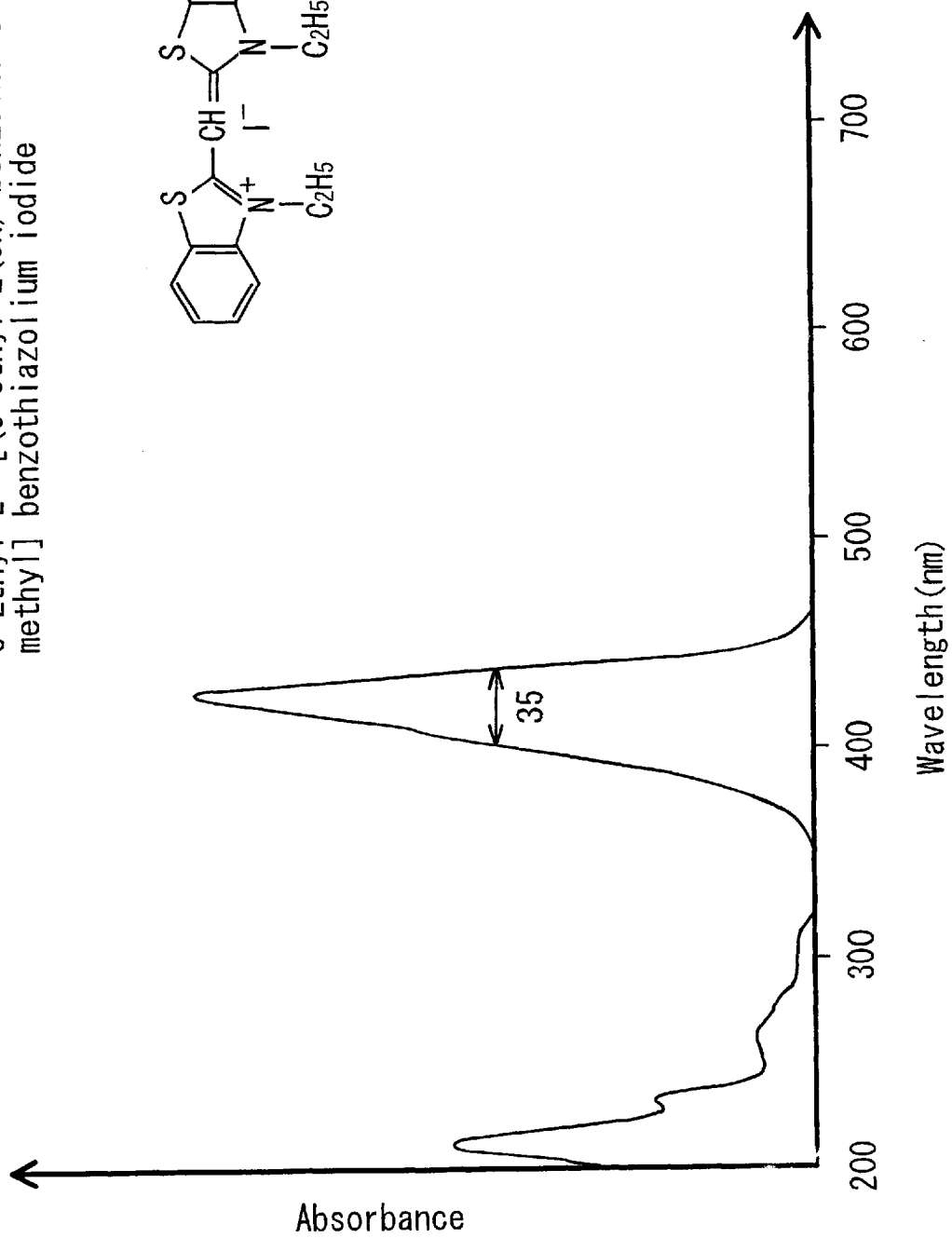
Figure 3:
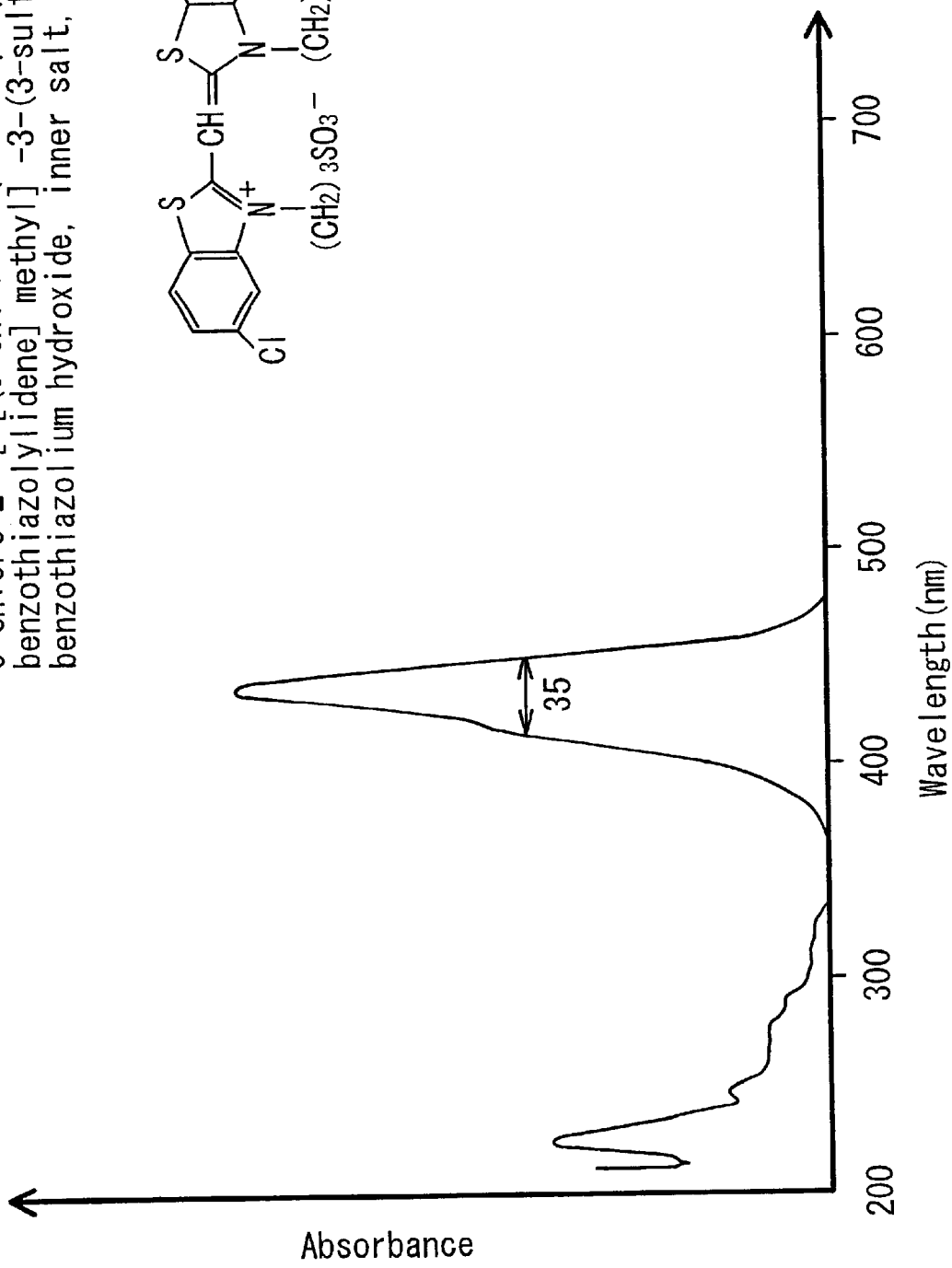
Figure 4:
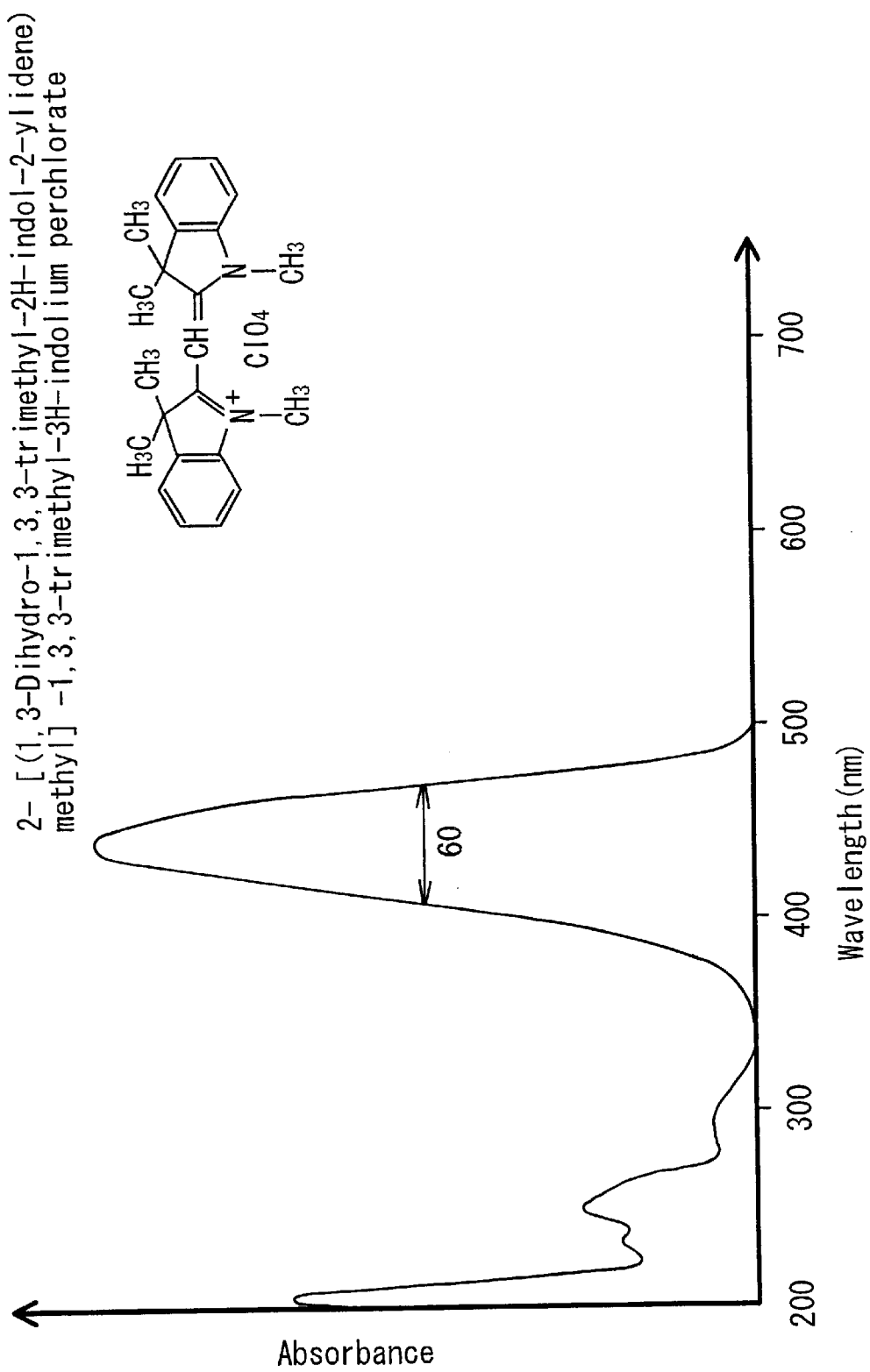
Figure 5:
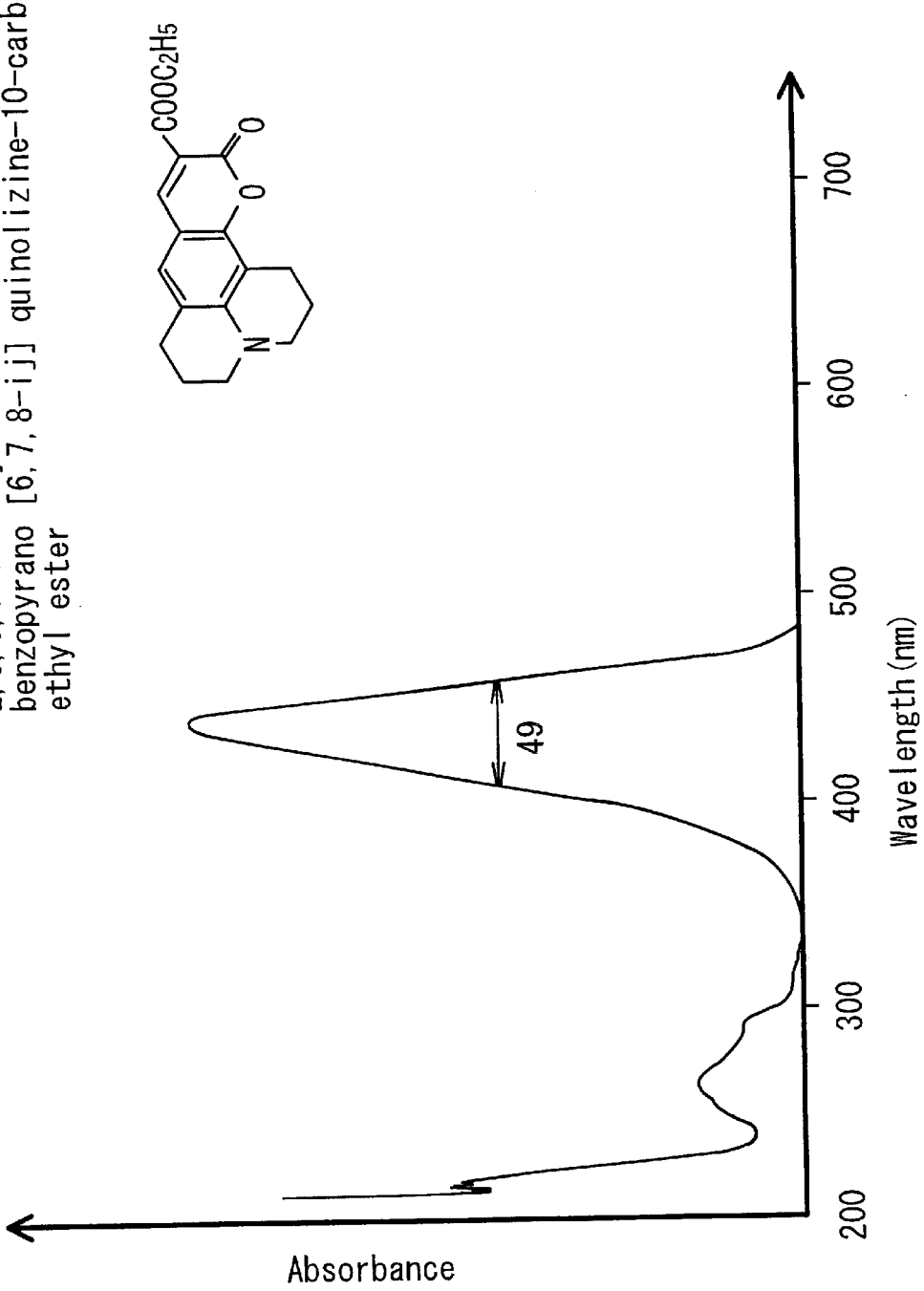
Figure 6:
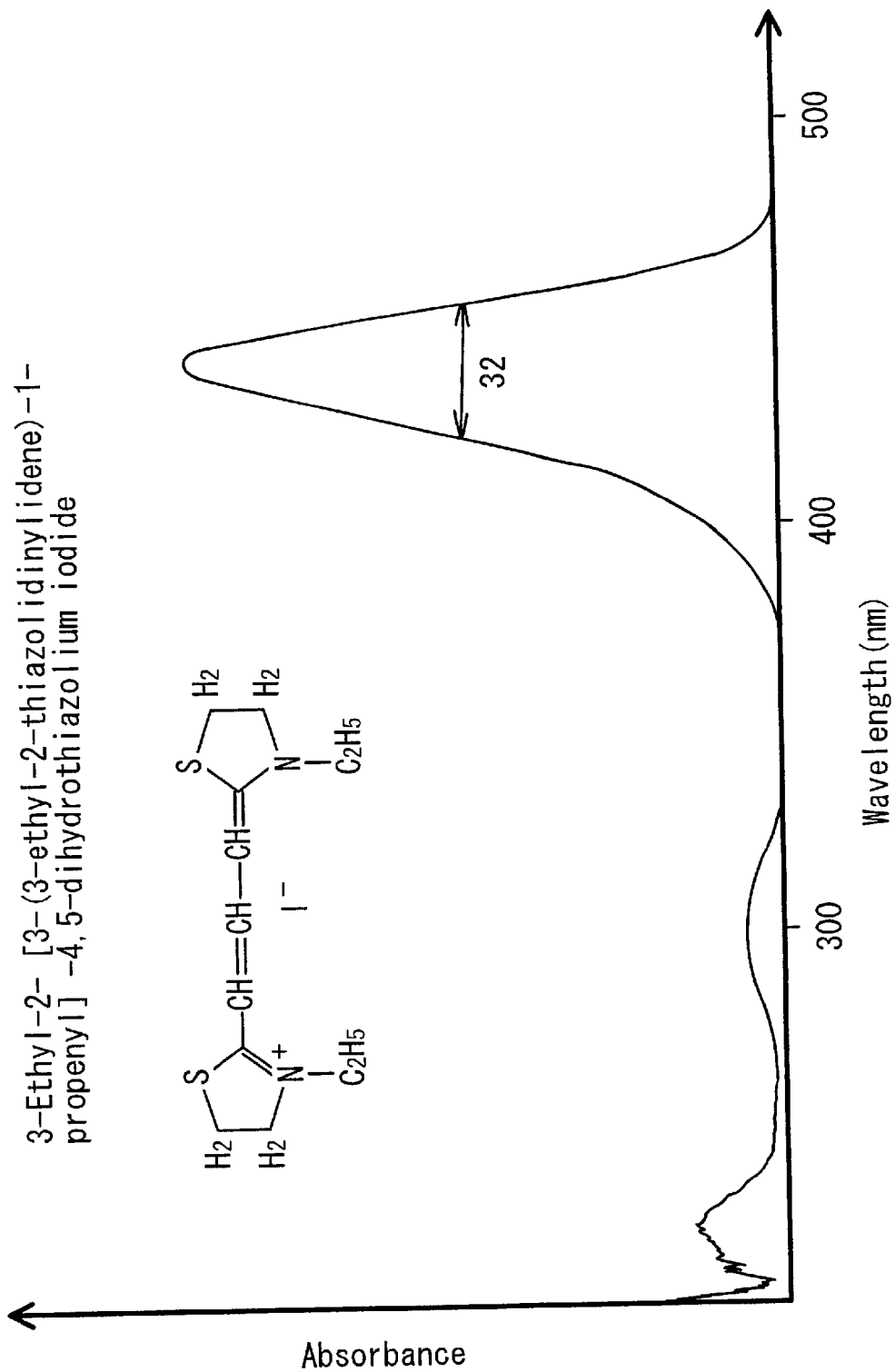
Figure 7:
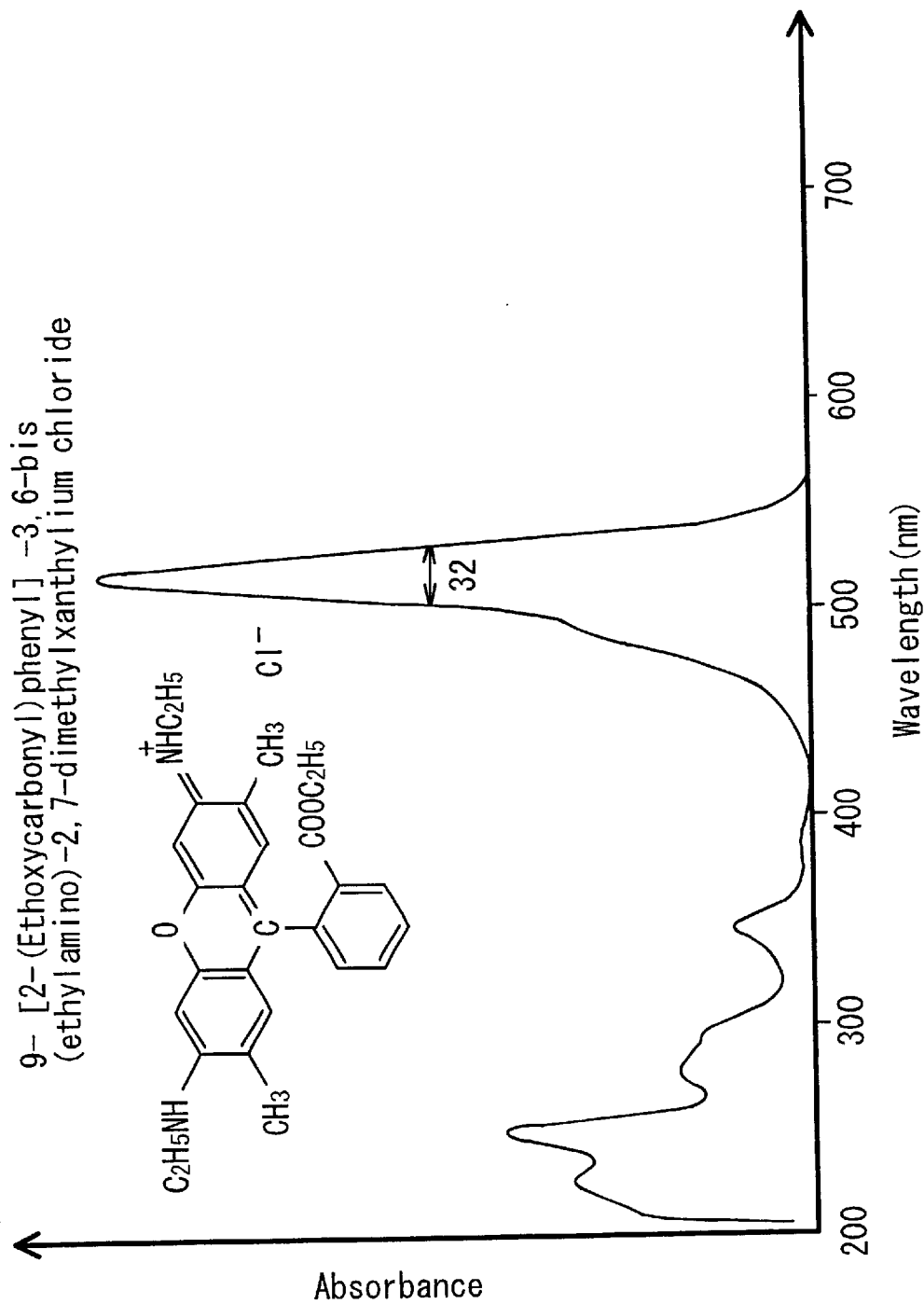
Figure 8:
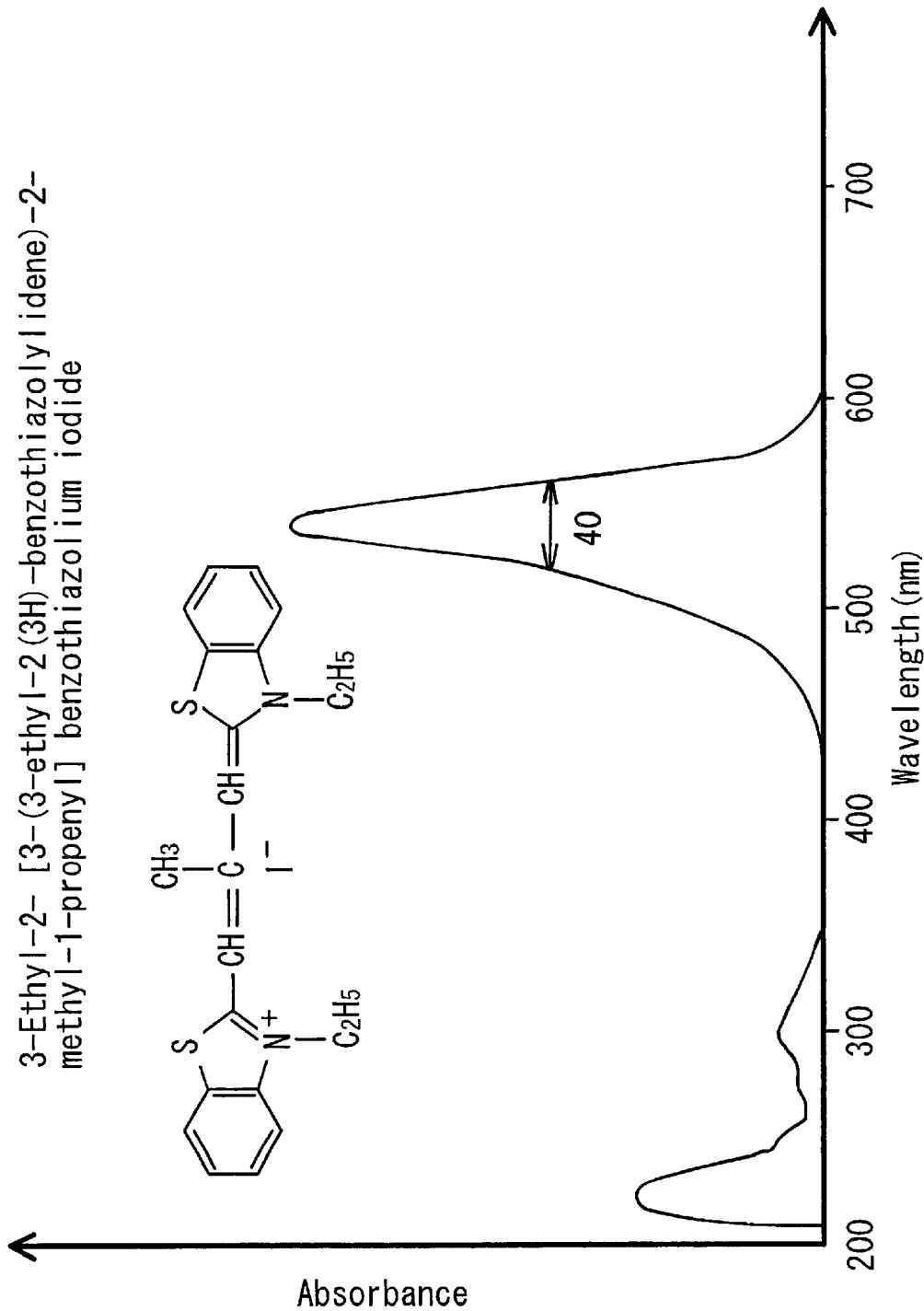
Figure 9:
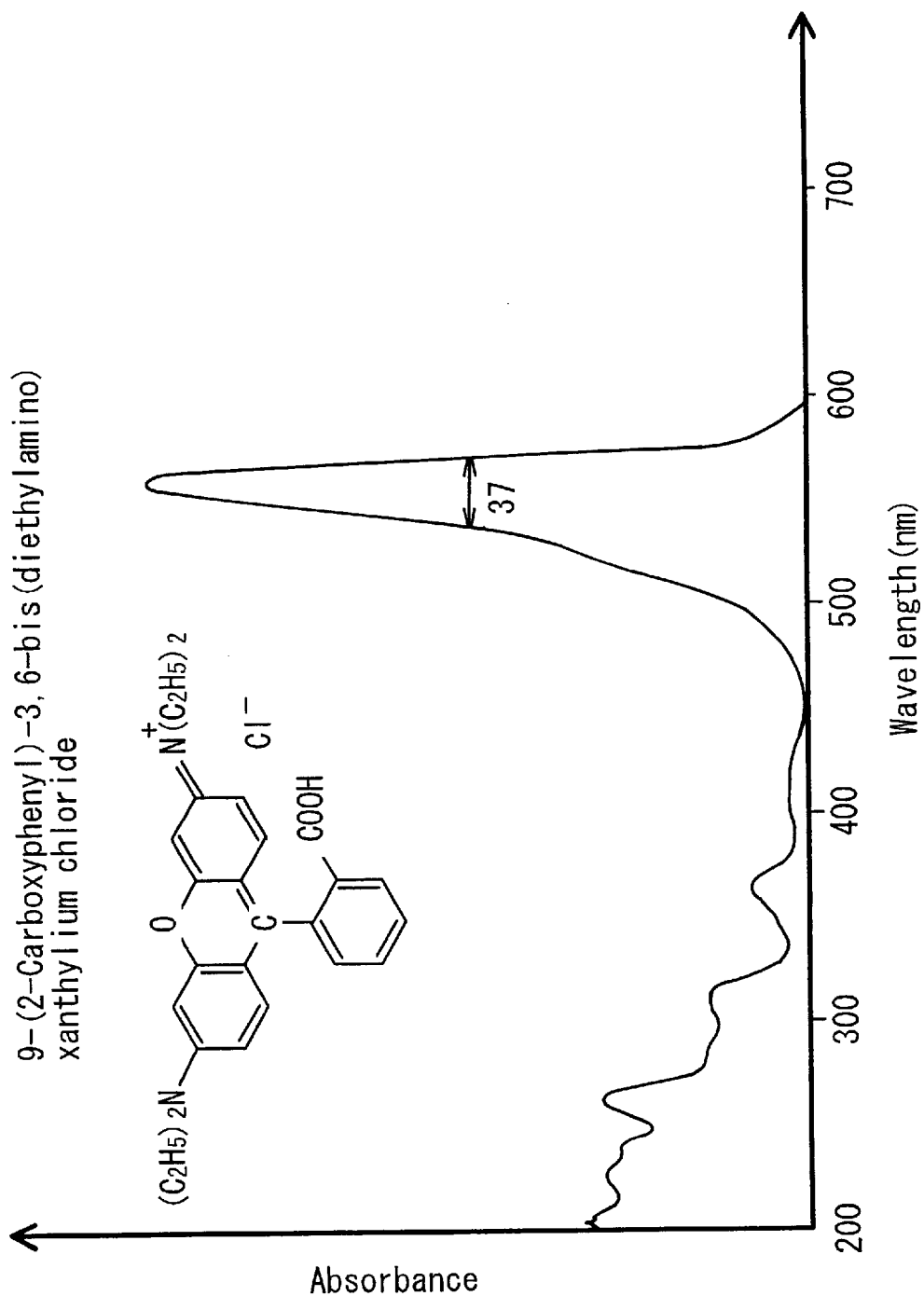
Figure 10:
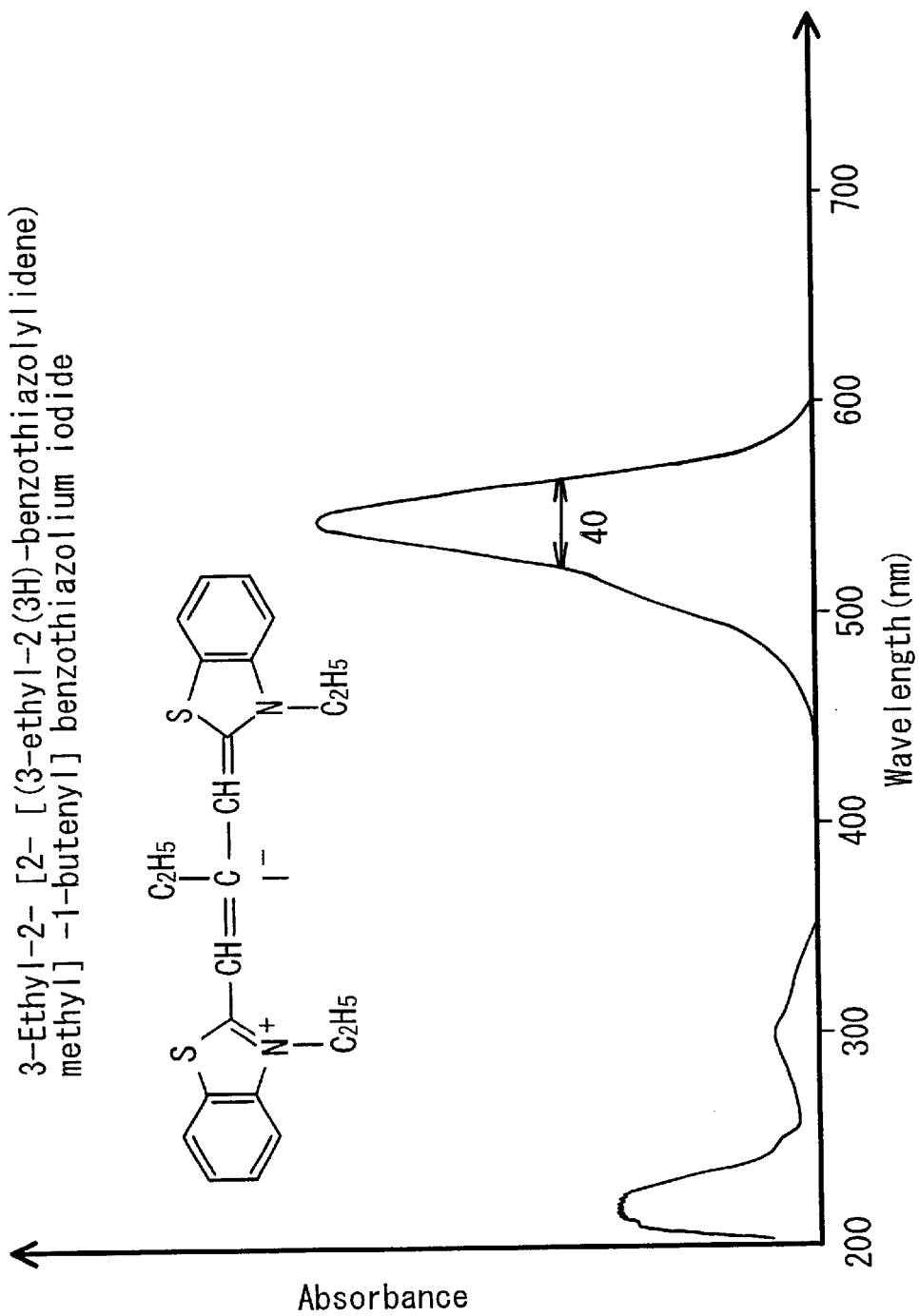
Figure 11:
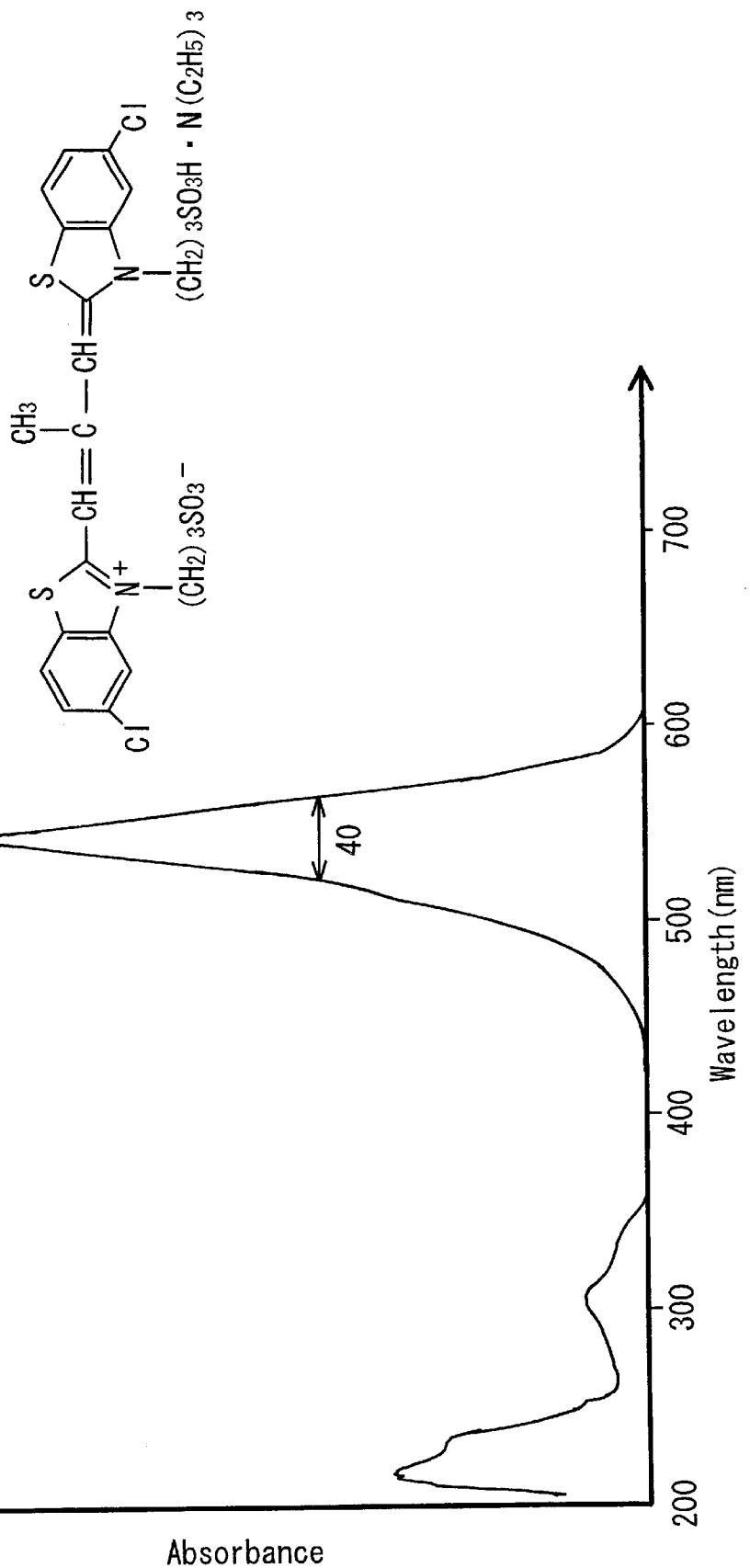
Figure 12:
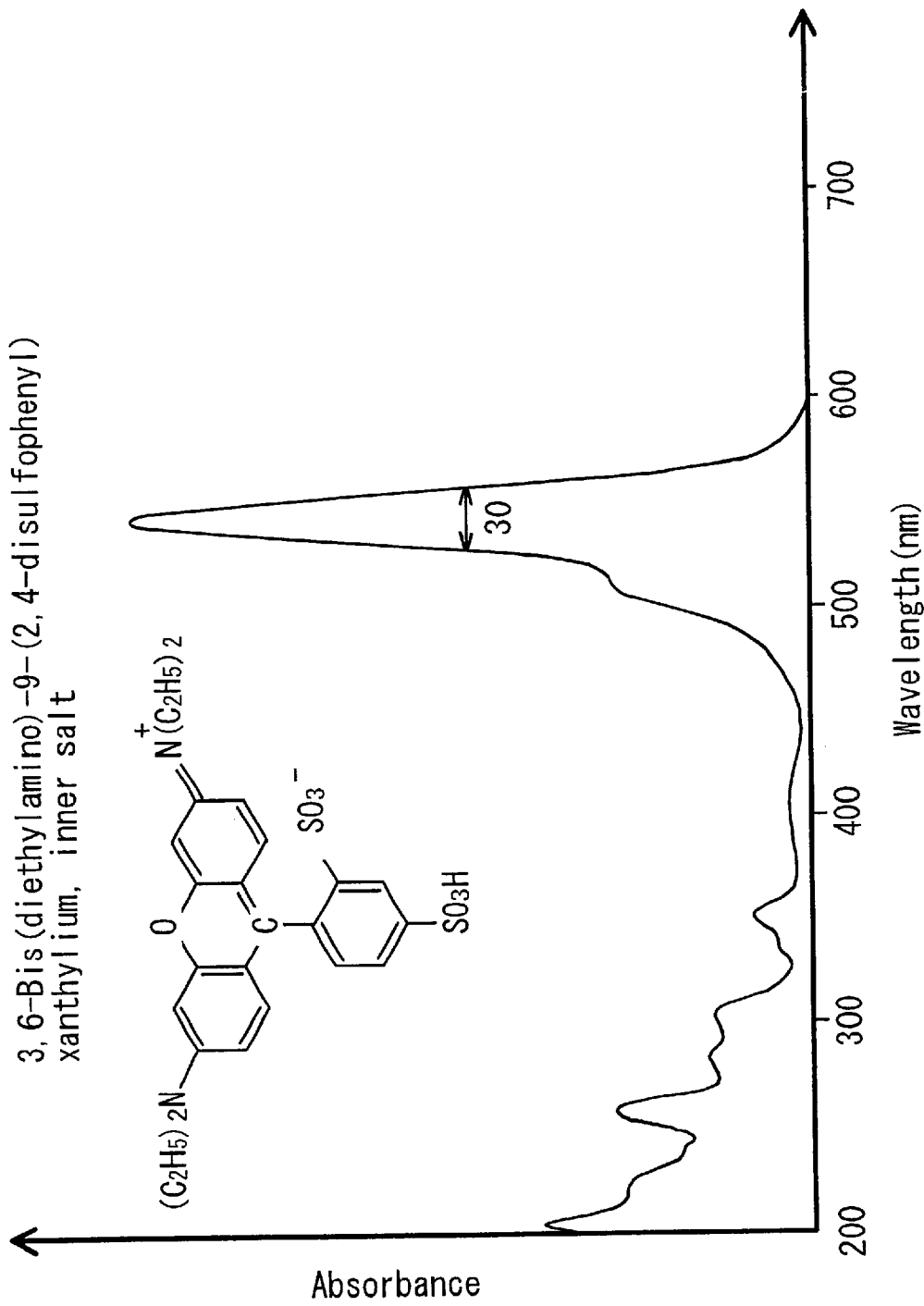
Figure 13:
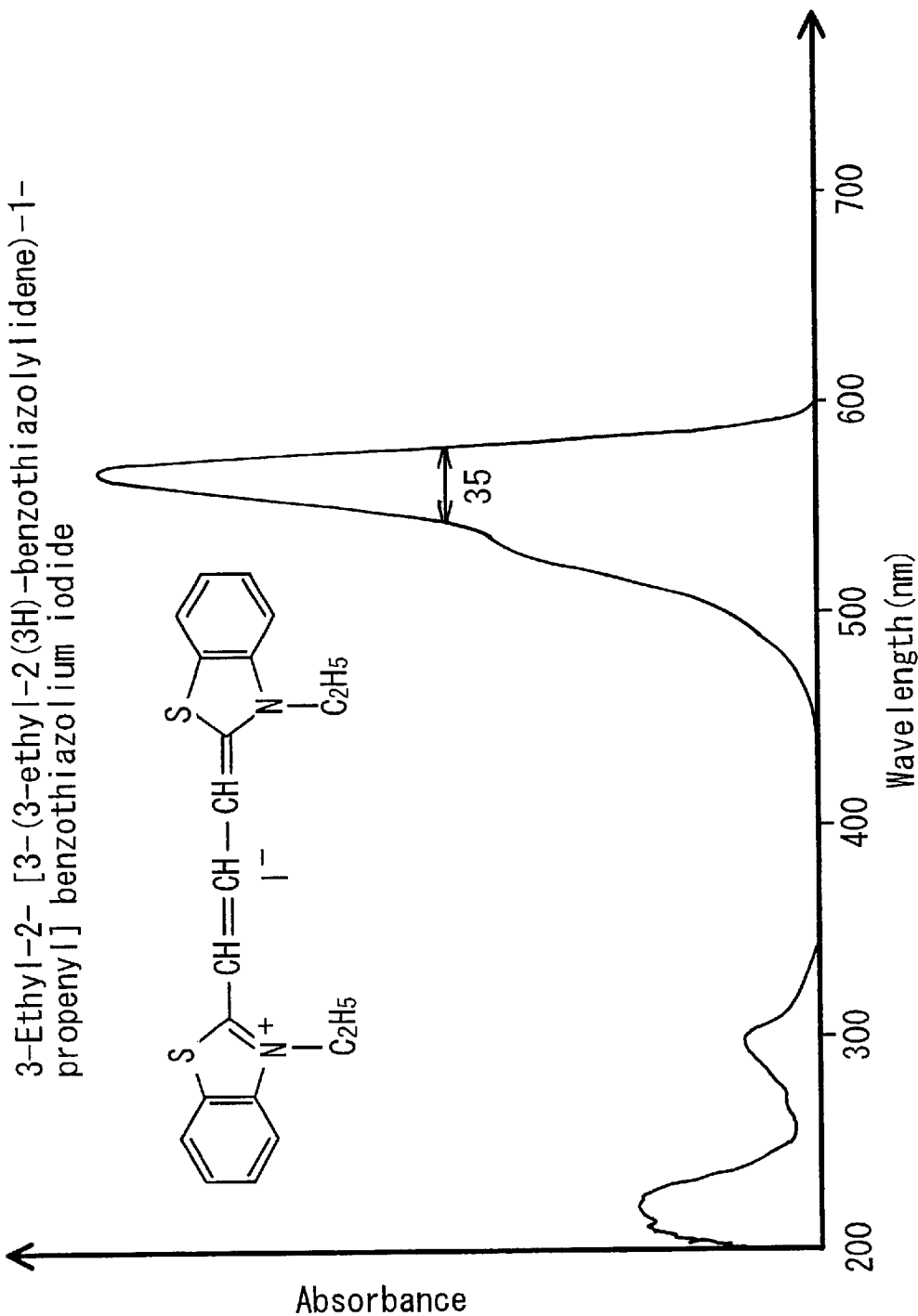
Figure 14:
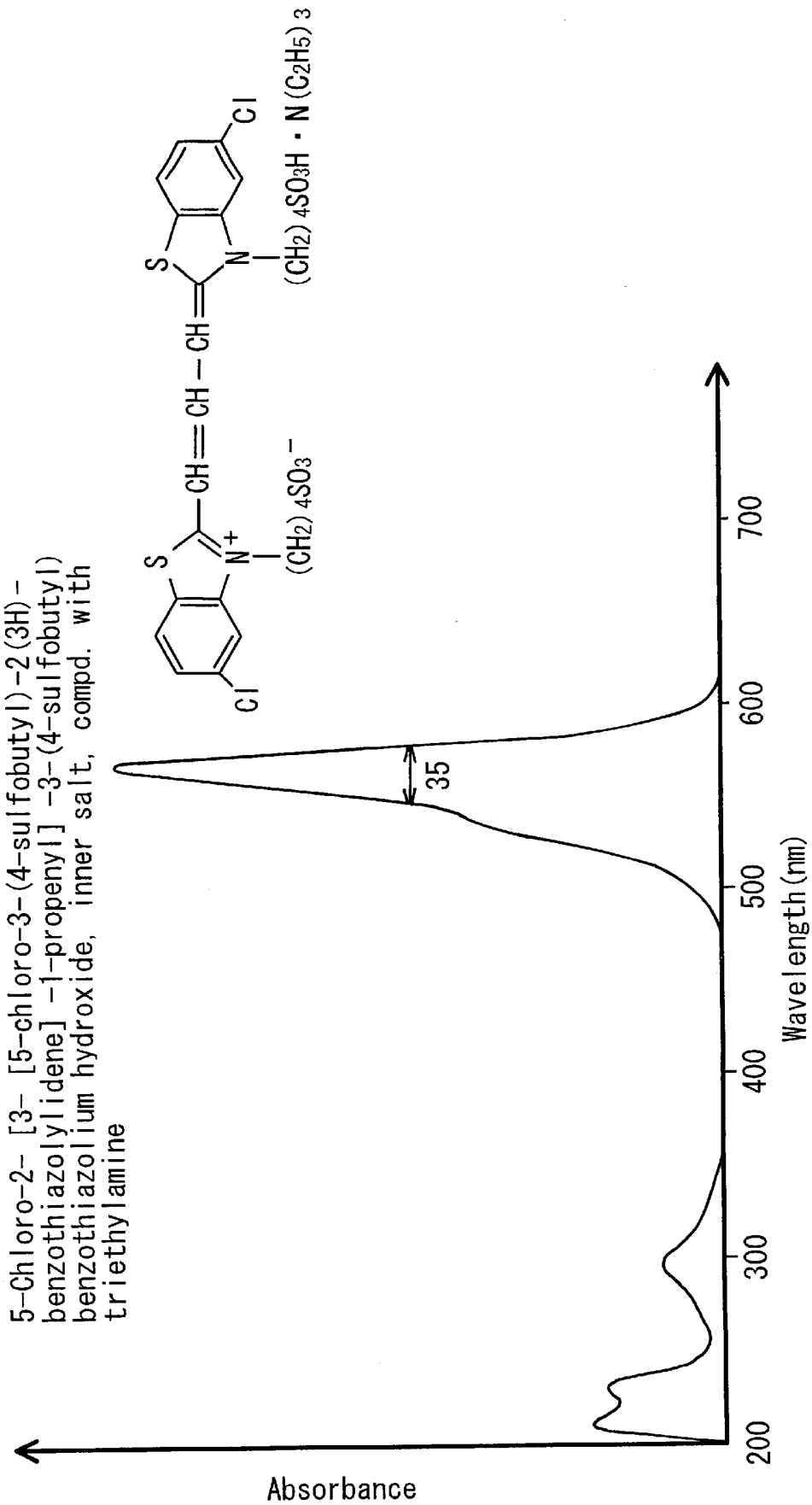
Figure 15:
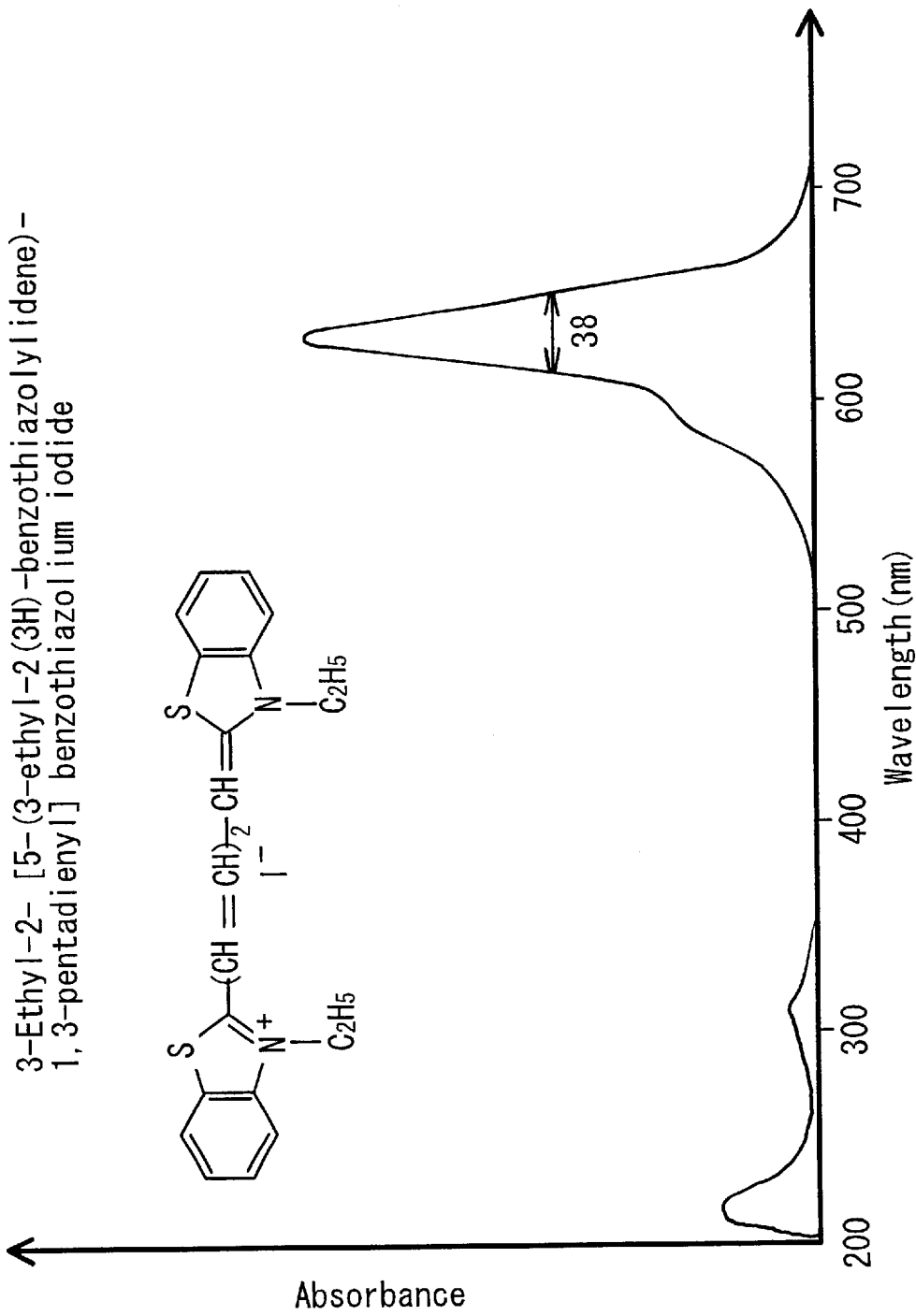
Figure 16:
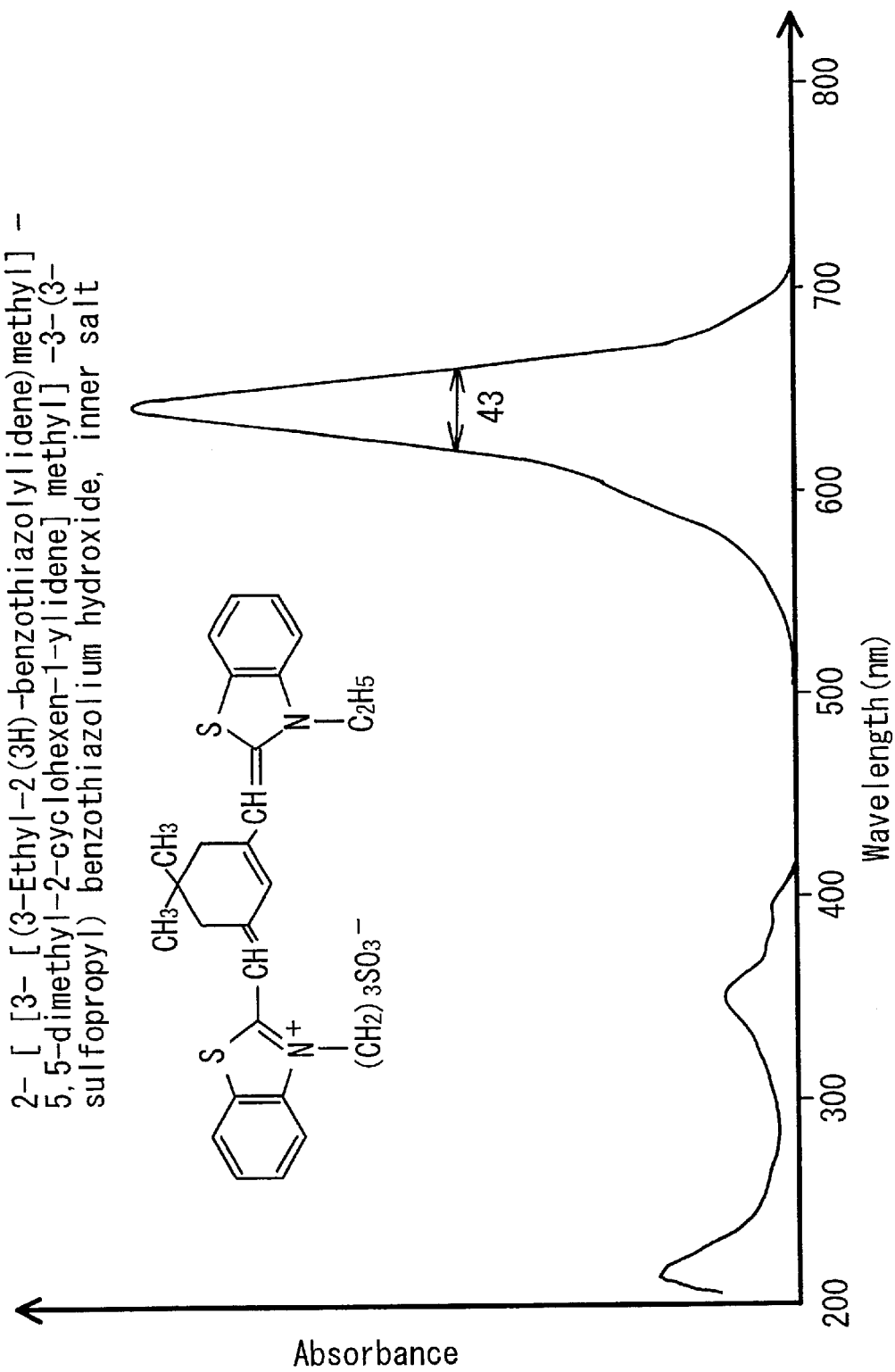
Figure 17:
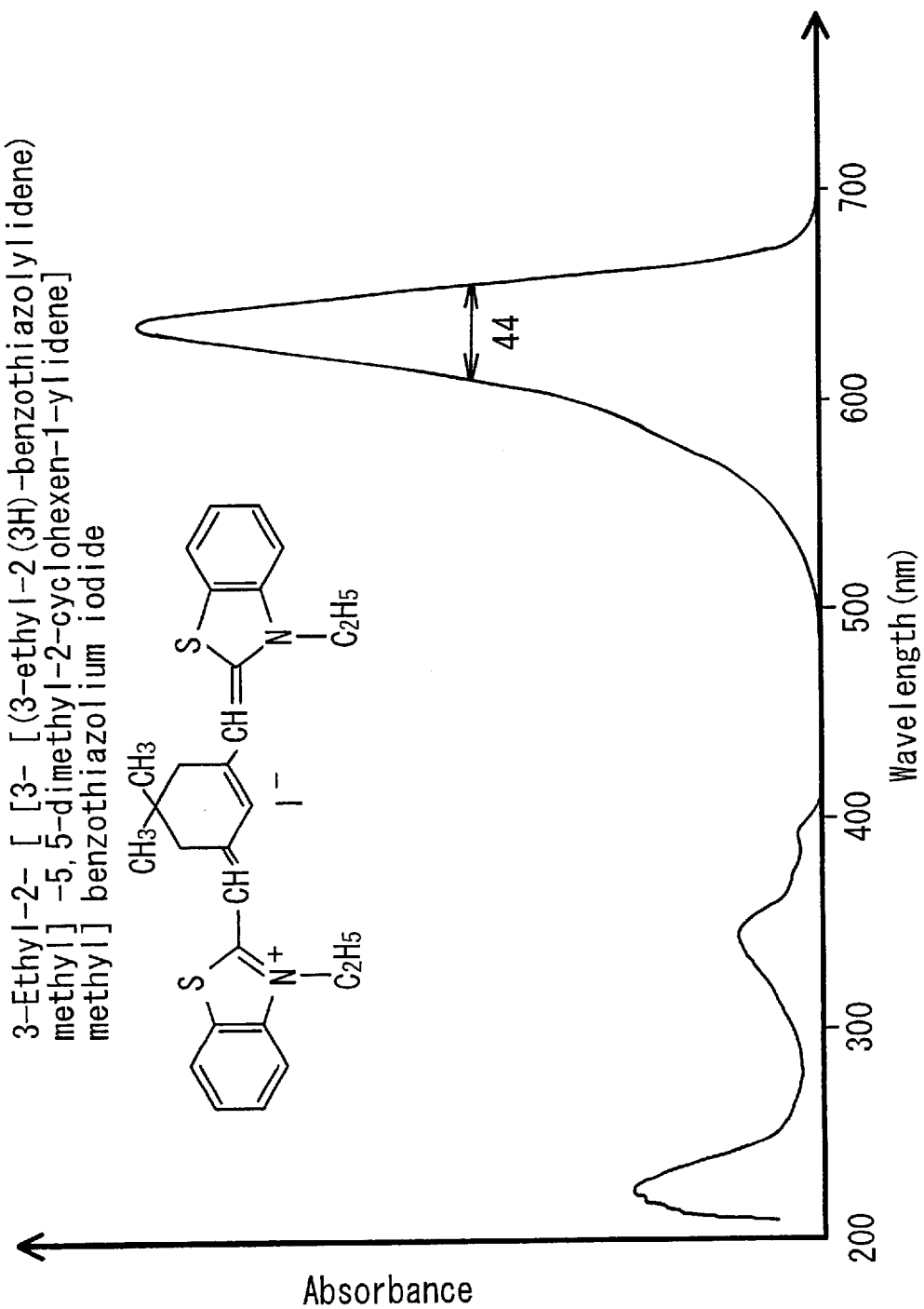
Figure 18:
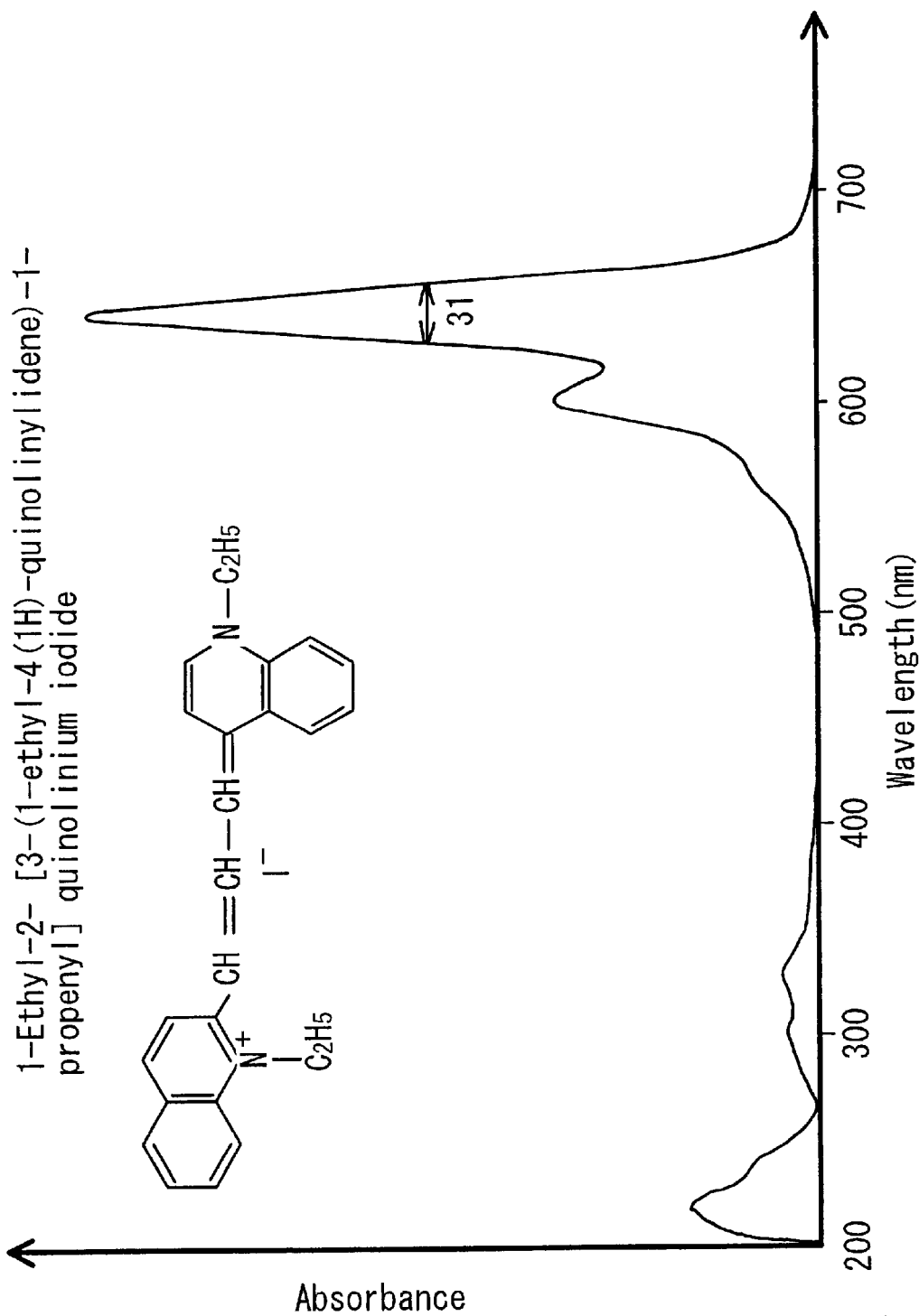
Figure 19:
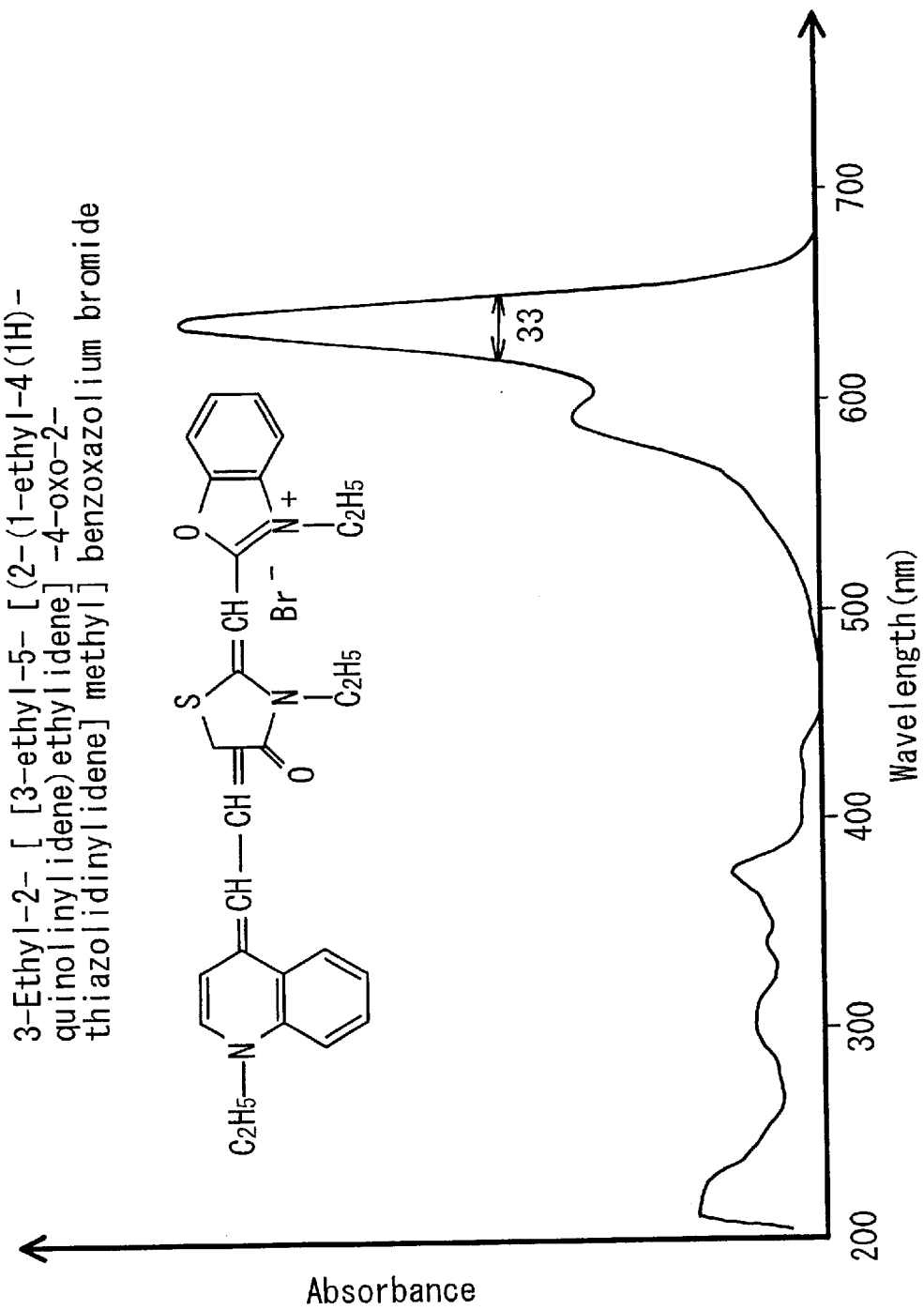
Figure 20:
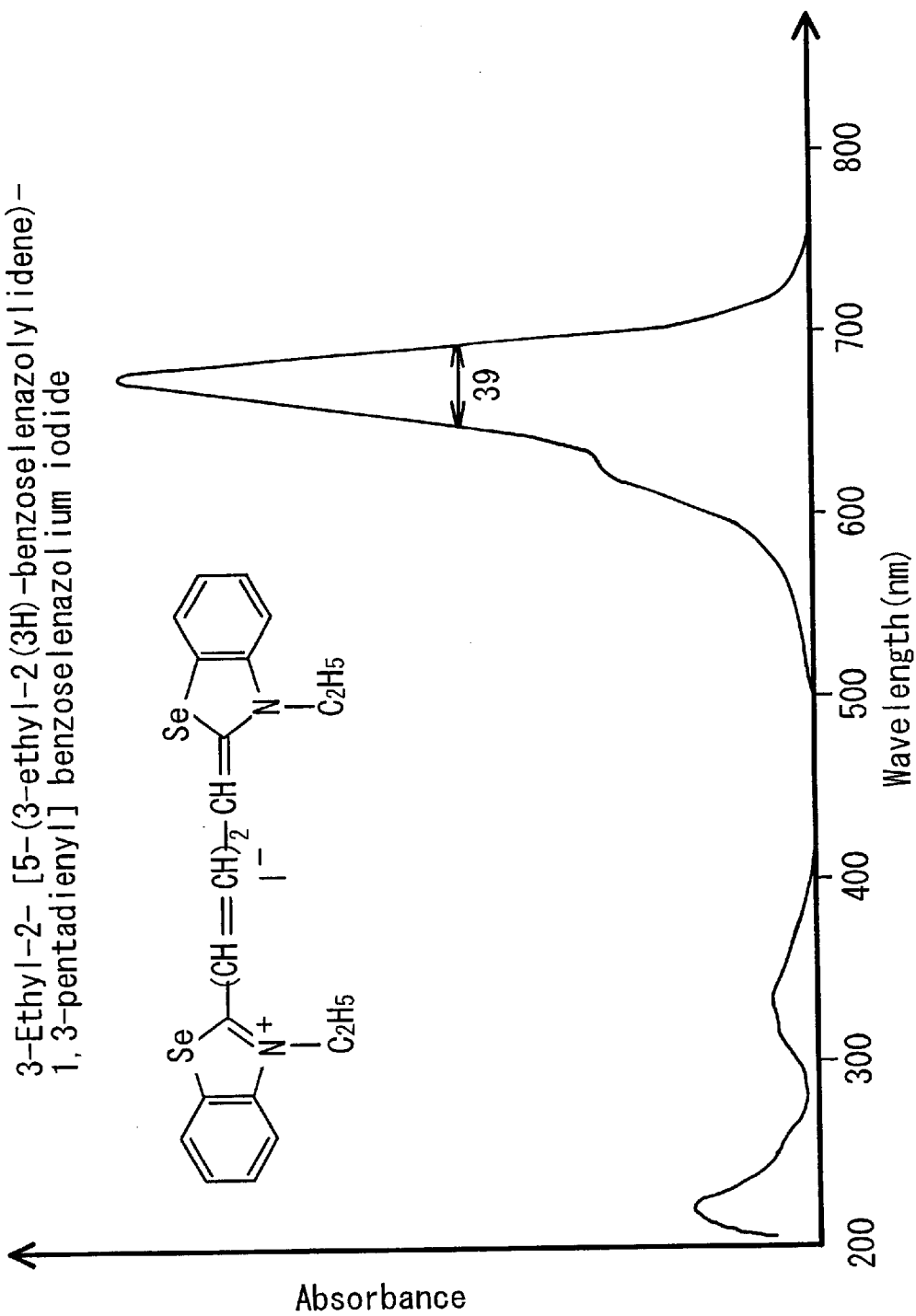
Figure 21:
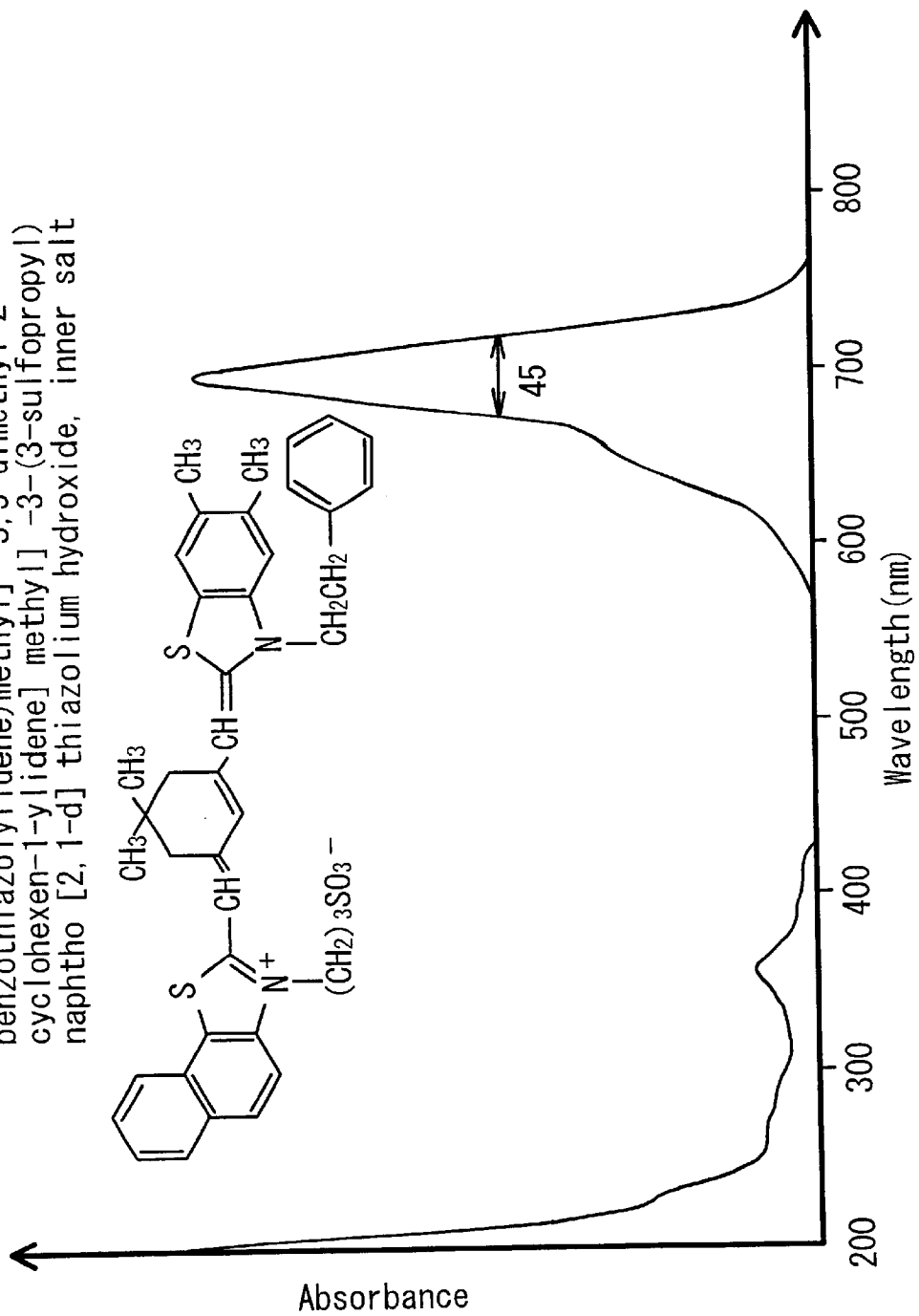
Figure 22:
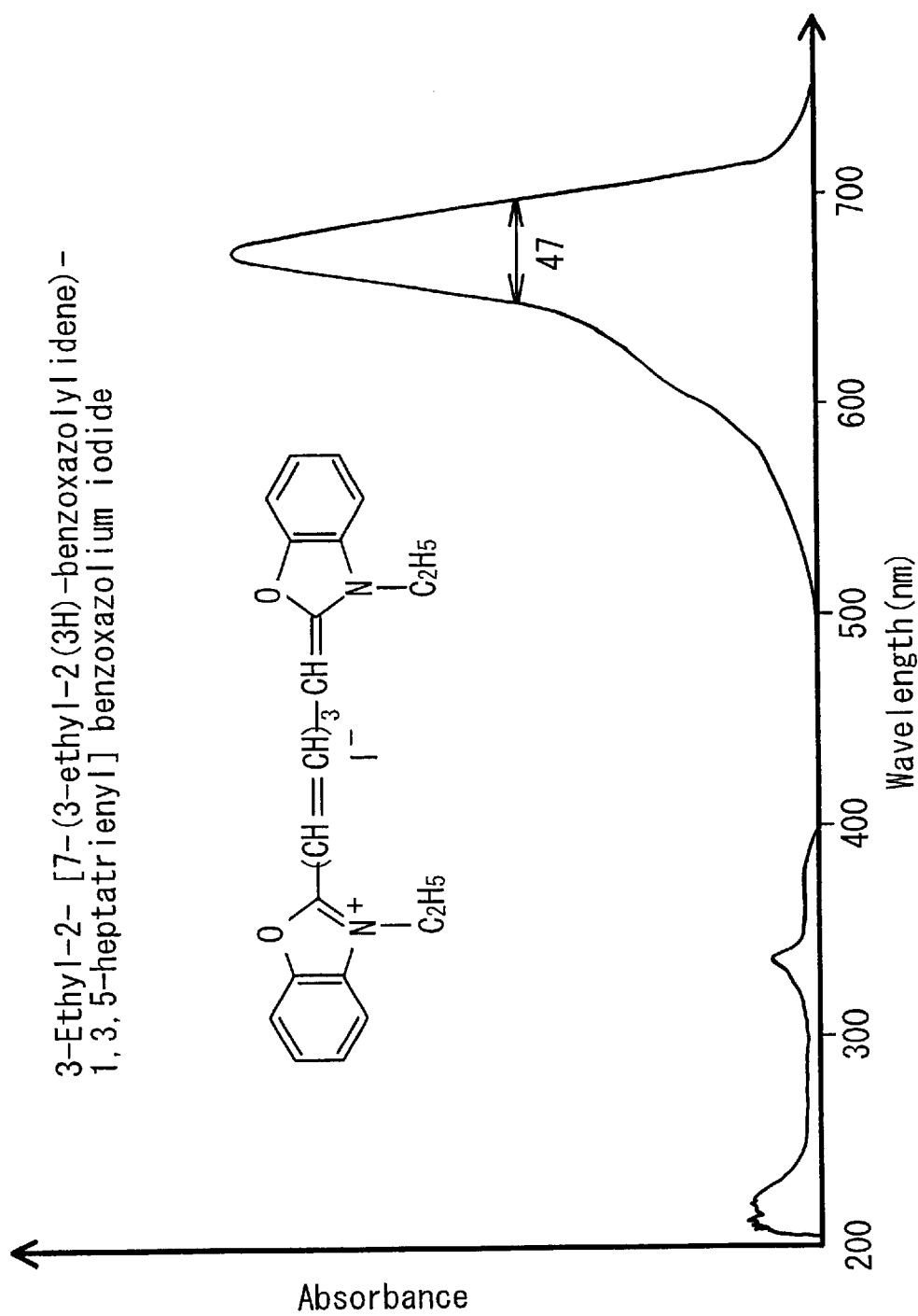
Figure 23:
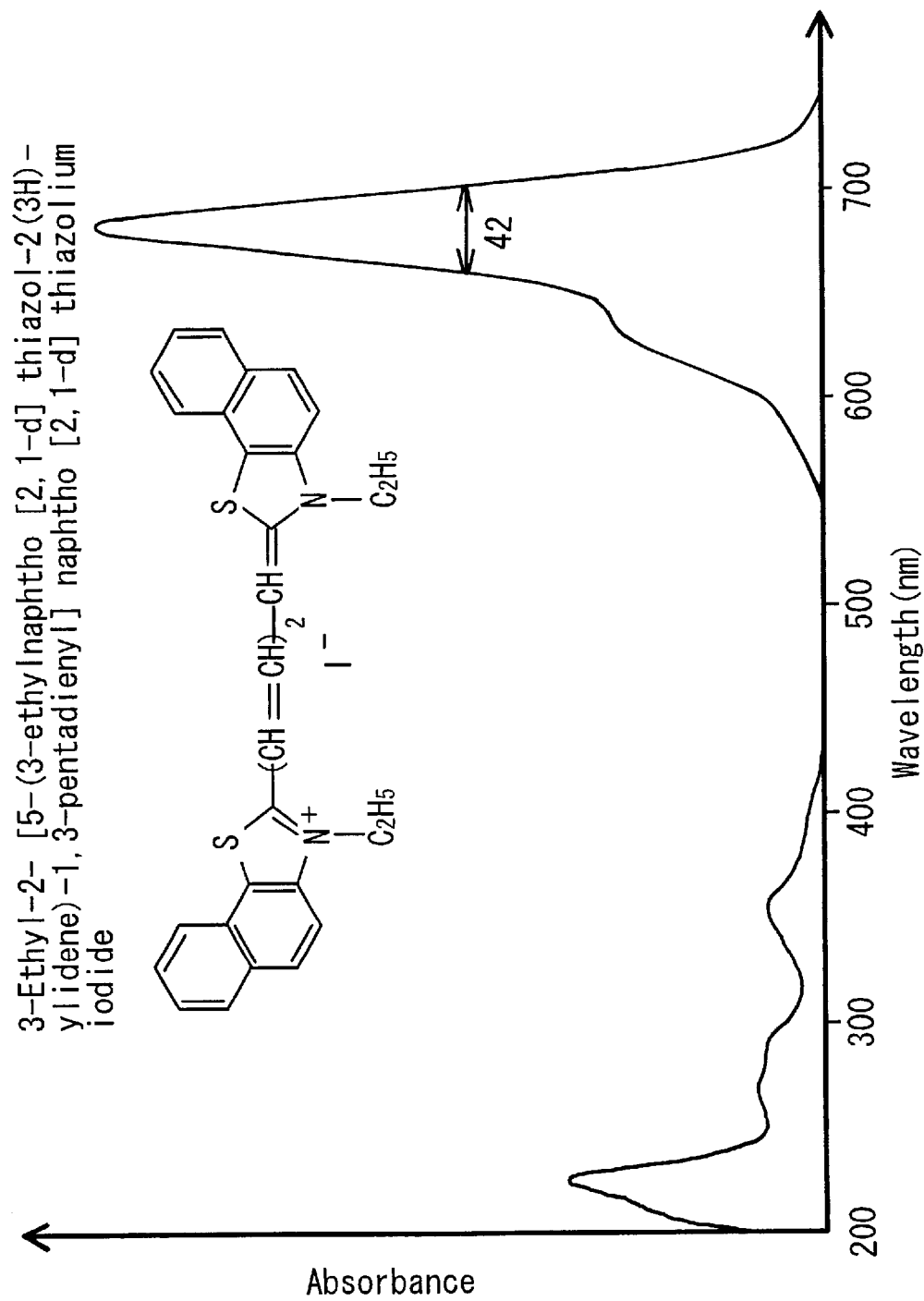
Figure 24:
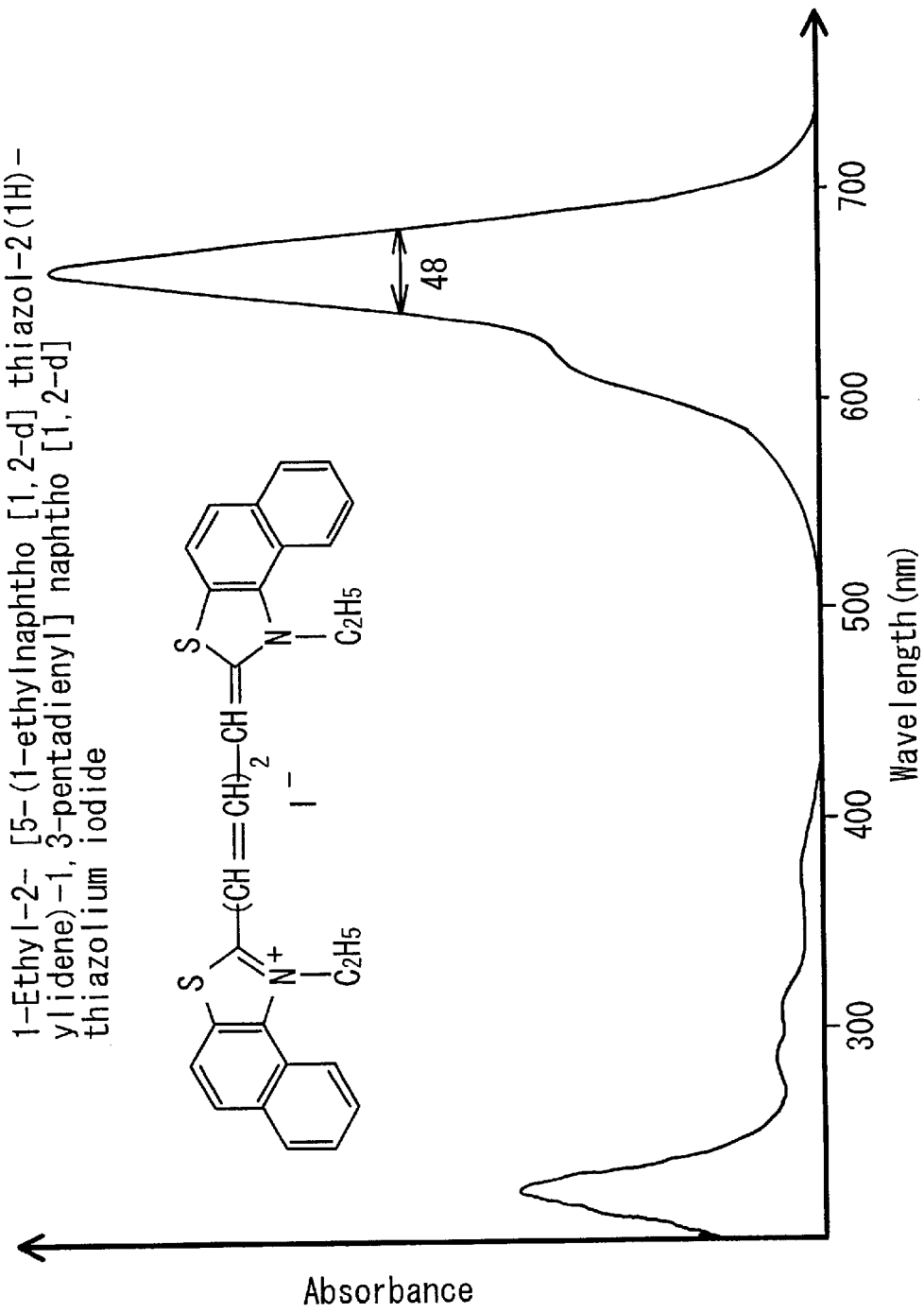
Figure 25:
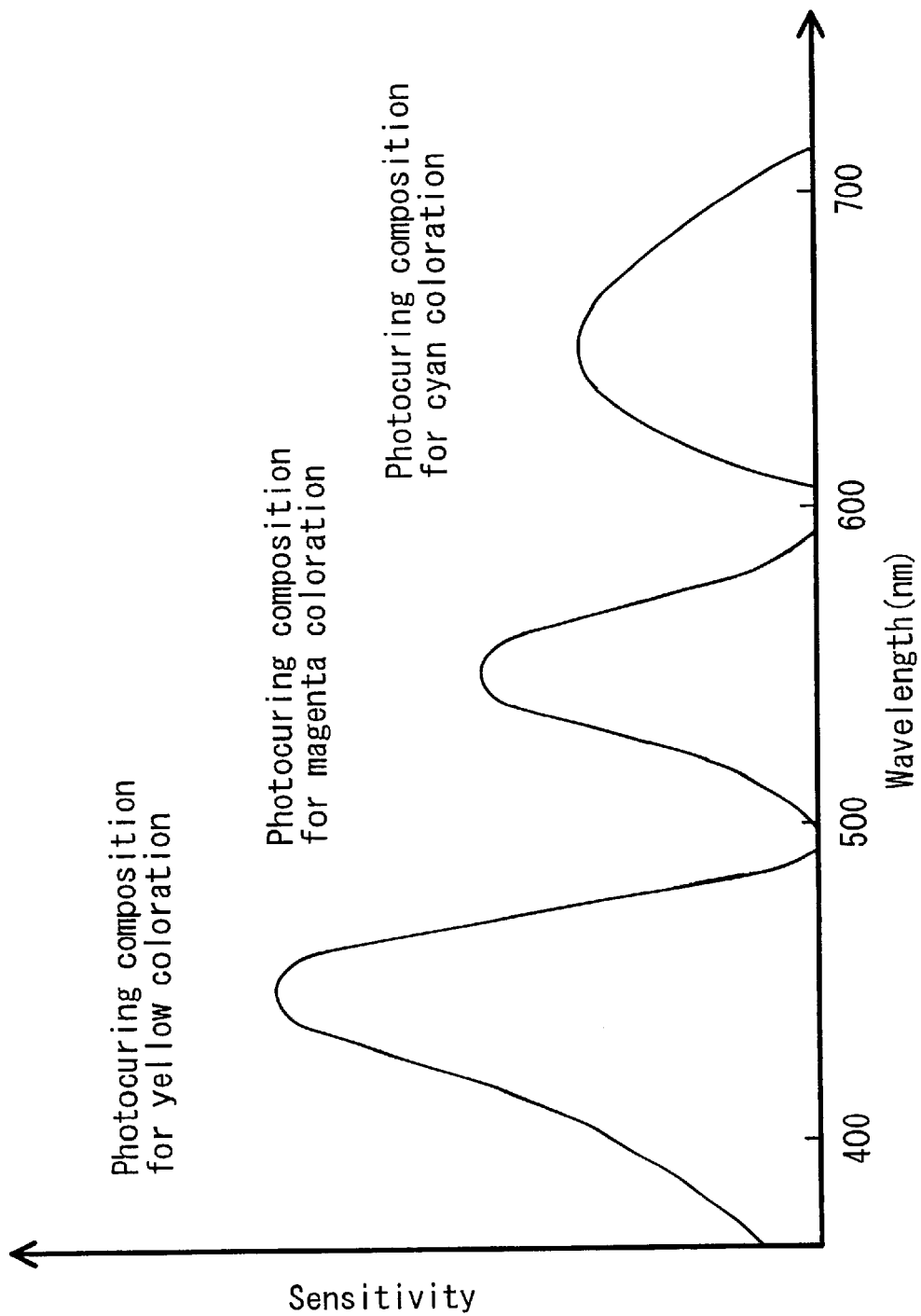

FIG. 25 is a graph showing the peak photosensitivity of the 3 types of photocuring compositions in microcapsules obtained in the Examples.

Figure 26:
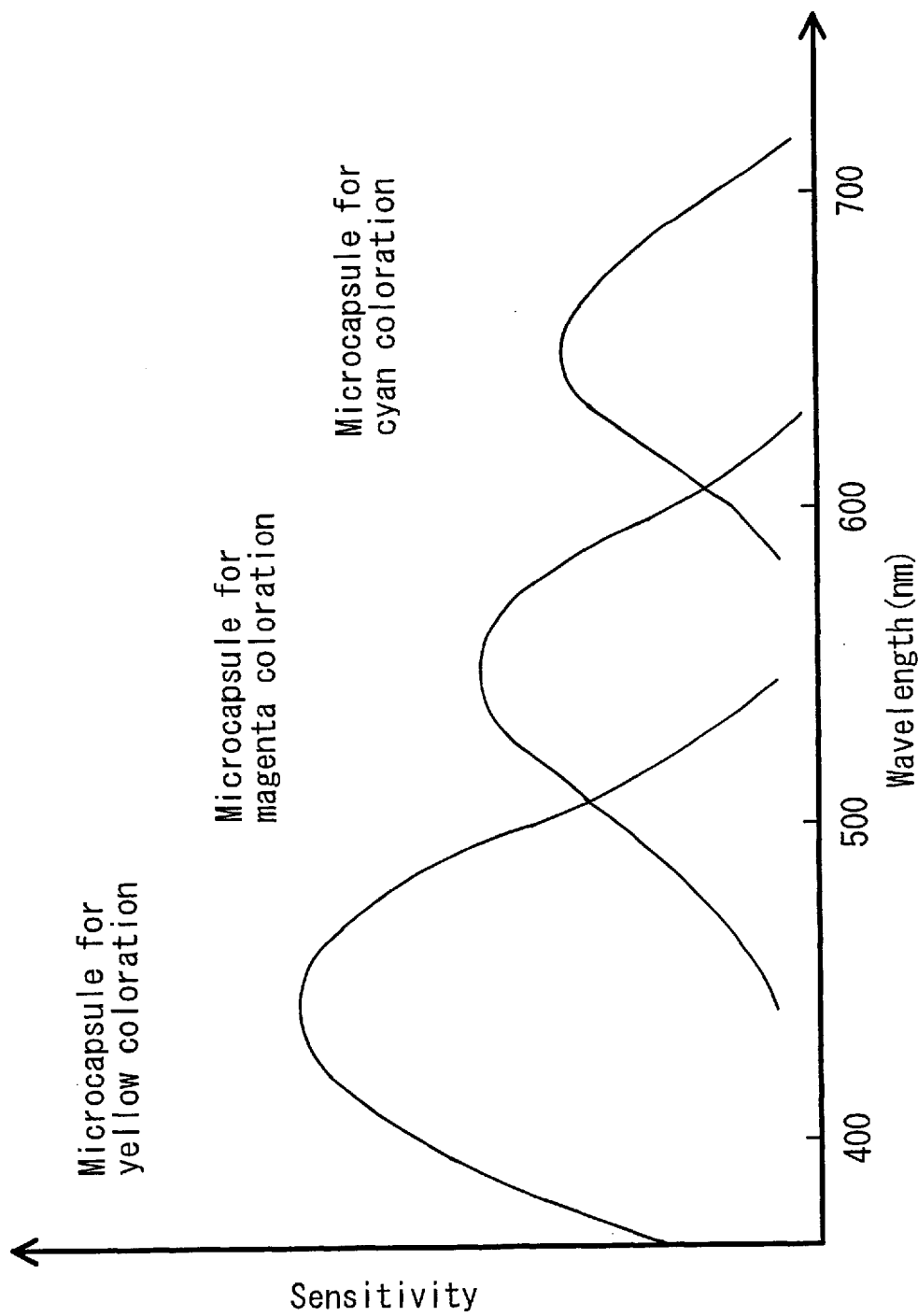

FIG. 26 is a graph showing the peak photosensitivity of 3 types of photocuring compositions in conventional microcapsules.

DETAILED DESCRIPTION OF THE INVENTION

The image-forming medium of the present invention comprises a substrate and several types of photocuring compositions with sensitivity peaks in different wavelength regions supported thereon. In each of the several types of photocuring compositions, contained are spectral sensitizers which are designed so that there is no apparent crosstalk in the image that is formed using the image-forming medium.

Each of the above-mentioned several types of photocuring compositions has to contain at least one spectral sensitizer so that each photocuring composition will have a sensitivity peak at a different wavelength region, and the photosensitive wavelength region of the photocuring composition is all but determined by this spectral sensitizer.

Examples of dyes that are generally used include xanthene dyes, coumarin dyes, merocyanide dyes, thiazine dyes, azine dyes, methine dyes, oxazine dyes, phenyl methane dyes, cyanine dyes, azo dyes, anthraquinone dyes, pyrazoline dyes, stilbene dyes, quinoline dyes, oxonole dyes, styryl dyes, base styryl dyes, indigoid dyes, carbonium dyes, phthalocyanine dyes, quinone imine dyes, rhodacyanine dyes, squarilium dyes, rhodamine dyes, etc., are used an the above-mentioned spectral sensitizer.

Of the above-mentioned spectral sensitizers, as narrow as possible a half-width of the wavelength absorption peak of each spectral sensitizer is preferred in order to prevent crosstalk. It is particularly preferred that the above-mentioned half-width be 50 nm or smaller.

Moreover, there are no special restrictions to the above-mentioned photocuring composition, but at least 3 types of photocuring compositions are needed to form a full-color image and therefore, at least 3 types of spectral sensitizers are usually necessary.

Moreover, there are no special restrictions to the photosensitive wavelength region of the photocuring composition (that is, the spectral sensitizer comprising the above-mentioned photocuring composition) as long as there is no apparent crosstalk, but taking into consideration an analog exposure system, the wavelength regions of blue, green, and red are preferred.

It is further preferred that the maximum absorption wavelength of the 3 types of spectral sensitizers be within a range of 400 to 470 nm, 530 to 570 nm, or 630 to 700 nm.

The spectral sensitizers with sensitivity to light in the blue, green, or red wavelength regions will now be described in succession.

First, examples of spectral sensitizers having sensitivity to light in the blue wavelength region include azo dyes, anthraquinone dyes, methine dyes, quinoline dyes, cyanine dyes, merocyanine dyes, oxonol dyes, styryl dyes, bass styryl dyes, coumarin dyes, stilbene dyes, etc. Of these, dyes with a maximum absorption wavelength (referred to below as $\lambda_{max}$) of 400 to 470 nm is preferred.

Actual examples of the above-mentioned spectral sensitizer include 3-ethyl-5-(1-methylnaphtho[1,2-d]oxazol-2 (1H)-ylidene)-2-thioxo-4-thiazolidinone ($\lambda_{max}$=421 nm); 3-ethyl-2-[(3-ethyl-2(3H)-benzothiazolylidene)methyl] benzothiazolium iodide ($\lambda_{max}$=423 nm): 5-chloro-2-[[5-chloro-3-(3 sulfopropyl)-2(3H)-bensothiazolidene]methyl]-3-(3-sulfopropyl)benzothiazolium hydroxide inner salt, sodium salt ($\lambda_{max}$=430 nm); 2-[(1,3-dihydro-1,3,3-trimethyl-2H-indol-2-ylidene)methyl]-1,3,3-trimethyl-3 H-indolium perchlorate ($\lambda_{max}$=432 nm); 2,3,6,7-tetrahydro-11-oxo-1H,5H,11H-[1]benzopyrano[6,7,8-ij]quinolidine-10-carboxy acid, ethyl ester ($\lambda_{max}$=438 nm); 3-ethyl-2-[3-(3-ethyl-2-thiazolidinylidene)-1-propenyl]-4,5-dihydrothiazolium iodide ($\lambda_{max}$=445 nm), etc.

FIGS. 1 through 6 are graphs showing the correlation between absorbance and wavelength in the above-mentioned spectral sensitizers, and these spectral sensitizers have $\lambda_{max}$ at 400 to 470 nm and their half-width is 60 nm or lower.

Examples of the spectral sensitizer having sensitivity to light in the green wavelength region include azo dyes. anthraquinone dyes, indigoid dyes, carbonium dyes, methine dyes, cyanine dyes, merocyanine dyes, oxonol dyes, styryl dyes, stilbene dyes, rhodamine dyes, etc. Of these, a dye with $\lambda_{max}$ at 530 to 570 nm is preferred.

Actual examples of the above-mentioned spectral sensitizer include 9-[2-(ethioxycarbonyl)phenyl]-3,6-bis (ethylamino)-2,7-dimethyl xanthium chloride ($\lambda_{max}$=530 nm); 3-ethyl-2-[3-(3-ethyl-2(3H)-bezothiazolylidene)-2-methyl-1-propenyl]benxothiazolium iodide ($\lambda_{max}$=543 nm); 9-(2-carboxyphenyl)-3,6-bis(diethylamino)xanthylium chloride ($\lambda_{max}$=546 nm); 3-ethyl-2-[2-[(3-ethyl-2(3H)-benzothiazolylidene)methyl]-1-butenyl]benzothiazolium iodide ($\lambda_{max}$=547 nm); 5-chloro-2-[3-[5-chloro-3-(3-sulfopropyl)-2(3H)-benzothiazolylidene]-2-methyl-1-propenyl]-3-(3-sulfopropyl)benzothiazolium hydroxide inner salt, triethylamine mixture ($\lambda_{max}$=548 nm); 3,6-bis (diethylamino)-9-(2,4-disulfophenyl)xanthylium inner salt ($\lambda_{max}$=554 nm); 3-ethyl-2-[3-(3-ethyl-2(3H)-benzothiazolylidene)-1-propenyl]benzothiazolium iodide ($\lambda_{max}$=557 nm); 5-chloro-2-[3-[5-chloro-3-(4-sulfobutyl)-2 (3H)-benzothiazolylidene]-1-propenyl]-3-[4-sulfobutyl) benzothiazolium hydroxide inner salt triethylamine compound ($\lambda_{max}$=566 nm), etc.

FIGS. 7 through 14 a graphs showing the correlation between absorbance and wavelength in the above-mentioned spectral sensitizers. These spectral sensitizers have a $\lambda_{max}$ at 530 to 570 nm and their half-width is 40 nm or less.

Examples of spectral sensitizers with sensitivity to light in the red wavelength region include anthraquinone dyes, phthalocyanine dyes, carbonium dyes, quinone imine dyes, methine dyes, cyanine dyes, merocyanine dyes, rhodacyanine dyes, oxonol dyes, sukuaririumu dyes, etc. Of these, those with $\lambda_{max}$ of 630 to 700 nm are preferred.

Actual examples of the above-mentioned spectral sensitizer include 3-ethyl-2-[5-(3-ethyl-2(3H)-benzothiazolylidene)-1,3-pentadienyl]benzothiazolium iodine ($\lambda_{max}$=652 nm); 2-[[3-[(3-ethyl-2(3H)-benzothiazolylidene)methyl]-5-dimethyl-2-cyclohexan-1-ylidene]methyl]-3(3-sulfopropyl)benzothiazolium hydroxide inner salt ($\lambda_{max}$=653 nm); 3-ethyl-2-[[3-[(3-ethyl-2(3H)-benzothiazolylidene)methyl]-5,5-dimethyl-2-cyclohexan-1-ylidene]methyl]benzothiazolium iodide ($\lambda_{max}$=653 nm); 1-ethyl-2-[3-(1-ethyl-4(1H)-quinolinylidene)-1propenyl] quinolinium iodide ($\lambda_{max}$=654 nm); 3-ethyl-2-[[3 ethyl-5-[2-(1-ethyl-4(1H)-quinolinylidene)ethylidene]-4-oxo-2-thiazolidinylidene]methyl]-benzoxazolium bromide ($\lambda_{max}$= 660 nm); 3-ethyl-2-[5-[(3-ethyl-2(3H)-benzoselenazolylidene)-1,3-pentadienyl]benzoselenazolium iodide ($\lambda_{max}$=663 nm); 2-[[3-[(5,6-dimethyl3-phenethyl-2 (3H)-benzothiazolylidene)methyl]-5,5-dimethyl-2-cyclohexane-1-ylidene]methyl]-3-(3-sulfopropyl)naphtho [2,1-d]thiazolium hydroxide inner salt ($\lambda_{max}$=676 nm); 3-ethyl-2-[7-(3-ethyl-2(3H)-benzoxazolylidene)-1,3,5-heptatriethyl]bonzoxazolium iodide ($\lambda_{max}$=683 nm); 3-ethyl-2-[5-(3-ethylnaphtho[2,1-d]thiazol-2(3H)-ylidene)-1,3-pentadienyl]naphtho[2,1-d]thiazolium iodide ($\lambda_{max}$=686 nm):) 1-ethyl-2-[5-(1-ethylnaphtho[1,2-d]thiazol-2(1H)-ylidene)-1,3-pentadienyl]naphtho[1,2-d]thiazolium iodide ($\lambda_{max}$=689 nm), etc.

FIGS. 15 through 24 are graphs showing the correlation between absorbance and wavelength in the above-mentioned spectral sensitizers. Theme spectral sensitizers have $\lambda_{max}$ at 630 to 700 nm and their half-width is 48 nm or less.

These spectral sensitizers can be used alone, or 2 or more can be used, and they should be selected so that there is no apparent crosstalk. For example, it is preferred that the difference between the wavelength on the long wavelength side, where sensitivity in $\frac{1}{10}$ the photosensitivity at the maximum wavelength of a photocuring composition for yellow image formation that is photosensitive to blue, and the wavelength on the short wavelength side, where sensitivity is $\frac{1}{10}$ the photosensitivity at the maximum absorption wavelength of a photocuring composition for magenta image formation that is photosensitive to green, be at least 10 nm or more.

This is the same between a photocuring composition for magenta image formation that is photosensitive to green light and a photocuring composition for cyan image formation that is photosensitive to red light.

The above-mentioned photocuring compositions usually comprise, in addition to the above-mentioned spectral sensitizers, a radiation sensitive composition, a photoinitiator, and an image-forming agent, A compound that goes through radical or ionic polymerization can be used as the above-mentioned radiation sensitive composition, of these, unsaturated group-containing are preferred and acrylic compounds are further preferred.

Examples of the above-mentioned acrylic compounds include acrylic acids and their salts, acrylic acid eaters, acrylamides, methacrylic acids and their salts, methacrylic acid esters, methacrylamides, and their derivatives, of these, acrylic acid eaters or methacrylic acid esters, etc., are preferred in particular.

Actual examples of the above-mentioned acrylic acid esters are butyl acrylate, cyclohexyl acrylate, ethyl hexyl acrylate, benzyl acrylate, furfuryl acrylate, ethoxyethyl acrylate, tricyclodecanyloxyacrylate, nonyl phenyloxyethyl acrylate, hexanediol acrylate, 1,3-dioxolane acrylate, hexanediol diacrylate, butanediol diacrylate, neopentyl glycol diacrylate, polyethylene glycol diacrylate, tricyclodecan dimethylol diacrylate, tripropylene glycol diacrylate, bisphenol A diacrylate, pentaerythritol triacrylate, dipentaerythritol hexaacrylate the hexaacrylate of the caprolactone addition product of dipentaerythritol, trimethylolpropane triacrylate, the triacrylate of the propylene oxide addition product of trimethylol propane, the diacrylate of polyoxyethylene-inserted bisphenol A, polyester acrylate, polyurethane acrylate, etc.

Actual examples of methacrylic acid esters are butyl methacrylate, cyclohexyl methacrylate, ethyl hexyl methacrylate, benzyl methacrylate, furfuryl methacrylate, ethoxyethyl methacrylate, hexanediol methacrylate, hexanediol methacrylate, 1,3-dioxolane methacrylate, butanediol dimethacrylate, neopentyl glycol dimethacrylate, bisphenol A dimethacrylate, pentaerythritol trimethacrylate, dipentaerythritol hexamethacrylate, the hexamethacrylate of the caprolactone addition product of dipentaerythritol, trimethylolpropane trimethacrylate, the trimethacrylate of the propylene oxide addition product of trimethylol propane, the dimethacrylate of polyoxyethylenated bis-phenol A, polyester methacrylate, polyurethane methacrylate, etc.

These unsaturated group-containing compounds can be used alone or 2 or more can be used.

Furthermore, there can be used compounds obtained by adding, cyclic organic compounds to the unsaturated group-containing compounds, and cyclic organic compounds alone can be used.

The above-mentioned photoinitiator, initiate polymerization of the polymeric compounds when exposed to light.

Examples of the above-mentioned photoinitiators are aromatic carbonyl compounds, acetophenones, organic peroxides, diphenyl halonium salts, organic halides, 2,4,6-substituted S-triazines, 2,4,5-triarylimidazole dimer, azo compounds, dye borate complexes, metallic arena complexes, titanocene compounds, etc.

Actual examples of these photoinitiators are benzophenone, benzil, xanthone, thioxanthone, anthraquinone, acetophenone, 2,2-dimethyl-2-morpholino-4'-methyl thioacetophenone, benzoyl peroxide, 3,3',4,4'-tetra(tertiary butyl benzophenone), diphenyl iodonium bromide, diphenyl iodonium chloride, carbon tetrachloride, carbon tetrabromide, 2,4,6-tris-trichloromethyl-S-triazine, $(\eta^5$-2,4-cyclopentadien-[1]-yl)[(1,2,3,4,5,6-$\eta$)-(1-methylethyl)-benzene]-iron(+1)-hexaflurophosphate (−1), etc.

These photoinitiators can be used alone, or 2 or more can be used.

Examples of the above-mentioned image-forming agents include pigments, dyes, and dye precursors that color-develope (change colors) when having reacted with a developer.

Examples of the above-mentioned dye precursor are diphenyl methane compounds, triaryl methane compounds, triphenyl methane compounds, bisphenyl methane compounds, xanthene compounds, thiazine compounds, fluoran compounds, spiropyran compounds, etc.

Theme image-forming agents can be used alone or 2 or more can be used.

The above-mentioned photocuring composition can be made into microcapsules by methods that have already become prior art in this industry. For instance, the method of phase separation from an aqueous solution, as shown in the specifications of U.S. Pat. No. 2,800,457, and U.S. Pat. No. 2,800,458, etc., the method of interfacial polymerization, as shown in Japanese Patent Publication No. 38-19574. Japanese Patent Publication No. 42-446, Japanese Patent Publication No. 42-771, etc., the in situ method by polymerization of a monomer, as shown in Japanese Patent Publication No. 36-9168, Japanese Patent Application Laid-open No. 51-9079, etc., the melt dispersion and cooling method, an shown in the specifications of U.K. Patent No. 952,807 and U.K. Patent No. 965,074, are examples.

Moreover, Japanese Patent Application Laid-open No. 55-15681, Japanese Patent Application Laid-open No. 56-100630, etc., teach examples of methods of producing microcapsules using polyvinyl alcohol as the wall material or wall material-formation promoter, and Japanese Patent Application Laid-open No. 57-110332, Japanese Patent Application Laid-open No. 57-116010, etc., are examples of methods of producing microcapsules whereby a cationic PVA is used as the wall material, etc., but the method of producing the microcapsules is not limited to these examples.

As long as the wall material can be made by the above-mentioned production methods, the material that forms the wall material can be inorganic or organic, but an organic compound is preferred, and a material that can sufficiently transmit light is further preferred.

Actual examples of the above-mentioned outside wall material are gelatin, gum arabic, starches, sodium alginate, polyvinyl alcohol, polyethylene, polyamide, polyester, polyurethane, polyurea, polystyrene, nitrocellulose, ethyl cellulose methyl cellulose, melamine/formaldehyde resin, and urea/formaldehyde resin; their copolymers, etc.

There are no special restrictions to the average particle diameter of the microcapsules, but 3 to 20 $\mu$m is preferred.

The image-forming medium of the present invention is obtained by supporting the photosensitive microcapsule obtained by the above-mentioned method on a substrate.

There are no special restrictions to the method by which the above-mentioned photosensitive microcapsules are supported on a substrate, and an example is the method whereby an emulsion comprising photosensitive microcapsules is applied to a substrate and dried.

Examples of the above-mentioned substrate are papers, such as paper, wood-free paper, coated paper, etc., films or sheets of polyester, polyethylene, polypropylene, acetyl cellulose, cellulose ester, polyvinyl acetal, polystyrene, polycarbonate, polyethylene terephthalate, polyimide, etc., synthetic paper composed of the above-mentioned papers and above-mentioned films or sheets, etc.

Of these, films of polyethylene terephthalate, etc., have excellent surface smoothness, strength, etc., and they are thin with a thickness of 0.05 mm or less and volume is relatively small, even when in rolled form. Therefore, these films are preferred.

Furthermore, the formation of a reflecting layer by aluminum deposition, etc., on at least one side of these films has the effect of improving spectral sensitivity of the photopolymerization composition and therefore, film with a reflecting layer can also be employed.

It is preferred that a hydrophilic binder be mixed and used with the dispersion of the photosensitive microcapsules when a photosensitive layer is formed by applying a solution comprising the photosensitive microcapsules on the above-mentioned substrate.

Examples of the hydrophilic binder include natural compounds such as gelatin, cellulose, starch, gum arabic, etc., and synthetic polymer compounds such as polyvinyl alcohol, polyvinyl pyrrolidone, polyacrylic acid, polymethacrylic acid, polyacrylamide, polyvinyl imidazole, polystyrene sulfonic acid, etc.

By means of the image-forming medium with the above-mentioned structure, spectral sensitizers, which have been designed so that there will be no apparent crosstalk in the image formed using the image-forming medium, are contained in the above-mentioned several types of photocuring compositions and therefore, a reduction in image density can realistically be prevented, even when exposure is performed using light that has been resolved with a simple, inexpensive device, such as a filter, etc.

EXAMPLE

The present invention will now be described in further detail by giving examples, but the present invention is not limited to this example only.

Example 1

First, a photocuring composition for yellow image formation containing yellow pigment and with a photosensitivity near 450 nm was made.

Two parts by weight azobarium lake yellow pigment were dispersed in 100 parts by weight dipentaerythritol hexaacrylate and phenol acrylate mixed at 1:1 using high polymer polyurethane as the dispersant.

Then 0.1 part by weight coumarin dye (7-diethylamino-3-butenoyl coumarin), which is a spectral sensitizer, and 2 parts by weight photoinitiator (($\eta^5$-2,4-cyclopentadien-1-yl)[(1,2,3,4,5,6-$\eta$)-(1-methylethyl)-benzene]-iron (1+) hexafluorophosphate (1−)) were added to this dispersion and it was heated for 10 minutes at 100° C.

After cooling, 1 part by weight N,N-dimethylaniline, which is a photosensitizer, was added to obtain a photocuring composition for yellow image formation.

Next, microcapsules encapsulating the above-mentioned photocuring composition with photosensitivity near 450 nm were made.

First, 100 g of the above-mentioned photocuring composition for yellow image formation were added to 100 cc of an aqueous 1:1 solution of an aqueous 5% partial sodium polystyrene sulfonate solution, which is an emulsifier, and an aqueous 5% styrene/maleic anhydride copolymer solution and agitated at 6000 r.p.m. for 5 minutes with a homogenizer to obtain a so-called O/W emulsion where liquid component was present in the aqueous solution as liquid drops with a size of 5 to 20 $\mu$m.

Commercial melamine powder was added to an aqueous 37% formaldehyde solution, and the pH of the obtained mixture was brought to 9.0 with sodium hydroxide solution. The mixture was heated for 30 minutes at a water temperature of 60° C. to obtain a melamine-formaldehyde prepolymer.

Next, the melamine-formaldehyde prepolymer was added to the O/W emulsion that had previously been made and kept for 5 hours in an agitated state at 100 to 300 revolutions with a homomixer, etc., while being heated at a water temperature of 80° C. Then pH of the mixture was adjusted to 7 and it was cooled to normal temperature. The wall material of melamine/formaldehyde resin was deposited around the liquid droplets of the O/W emulsion to obtain a microcapsule emulsion.

Next, a photocuring composition for magenta image formation containing magenta pigment and having photosensitivity near 550 mm was made.

Two parts by weight quinacridone magenta pigment were dispersed in 100 parts of a 1:1 mixture of dipentaerythritol hexaacrylate and phenol acrylate using high polymer polyurethane as the dispersant. Then 0.1 part by weight cyanine dye (5-chloro-2-[3-[5-chloro-3-(4-sulfobutyl)-2(3H)-benzothiazolylidene]-1-propenyl]-3-(4-sulfobutyl) benzothiazolium hydroxide inner salt), which is a sensitizer that was selected so that there would be no apparent crosstalk with the above-mentioned photocuring composition for the yellow image formation, and 2 parts by weight photoinitiator (($\eta^5$-2,4-cyclopentadien-[1]-yl) [(1,2,3,4,5,6-$\eta$)-1-(1-methylethyl)-benzene]-iron (1+)-hexafluorophosphate (1−)) were added to this dispersion and heated for 10 minutes at 100° C.

After cooling, 1 part by weight N,N-dimethylaniline, which is a photosensitizer, was added to obtain a photocuring composition for magenta image formation.

The microcapsules encapsulating the above-mentioned photocuring composition with photosensitivity near 550 nm were made by the same method as used to produce the microcapsules encapsulating the photocuring composition having photosensitivity near 450 nm.

Next, a photocuring composition for cyan image formation containing cyan dye and having a photosensitivity near 650 nm was made.

Three parts by weight phthalocyanine cyan pigment were dispersed in 100 parts by weight of a 3:1 mixture of dipentaerythritol hexaacrylate and phenol acrylate using high polymer polyurethane as the dispersant. Then 0.05 parts by weight cyanine dye (3-ethyl-2-[5-(3-ethylnaphtho[2,1-d]thiazol-2(3H)-ylidene)-1,3-pentadienyl]naphtho[2,1-d]thiazolium iodide), which is a spectral sensitizier that was selected so that there would be no apparent crosstalk with the above-mentioned photocuring composition for magenta image formation, and 2 parts by weight photoinitiator (($\eta^5$-2,4-cyclopentadien-1-yl)[(1,2,3,4,5,6-$\eta$)-(1-methylethyl)-benzene]-iron (1+)-hexafluorophosphate(1−)) were added and heated for 10 minutes at 100° C.

After cooling, 1 part by weight N,N-dimethylaniline, which is a photosensitizer, was added to obtain a photocuring composition for cyan image formation.

The above-mentioned microcapsules encapsulating the photocuring composition with photosensitivity near 650 nm were made by the same method as used to make the microcapsules encapsulating photocuring composition with photosensitivity near 450 nm.

Appropriate amounts of the 3 types of microcapsules that were obtained in this way were mixed and binder, such as water-soluble polyester, etc., leveling agent, and surfactant, such as sulfosuccinic acid diester sodium salt, etc., wore further added to prepare the solution for coating.

Next, this solution was applied to a white sheet of polyethylene terepthalate (PET) to a film thickness of 10 to 18 $\mu$m and dried to obtain an image-forming medium.

The image-forming medium with the above-mentioned structure was set in a spectral sensitivity gauge (available from Narumi Shokai) and photosensitivity was determined for 30 seconds. FIG. 25 is a graph showing the determination results from the Example.

As is clear from the graph in FIG. 25, the peak photosensitivity corresponding to the 3 photocuring compositions are not overlapping and an image-forming medium is obtained with which realistically, no crosstalk generated.

Next, when a filter was placed on a commercial 100 W halogen lamp and exposure was performed with light that had been resolved to blue, green and red using the above-mentioned image-forming medium, an image with no reduction in density was obtained.

As is clear from the above-mentioned description, by means of the image-forming medium of the present invention, spectral sensitizers, which have been designed so that there is no apparent crosstalk in the image formed using the image-forming medium, are contained in each of the aforementioned several types of photocuring composition and therefore, an image-forming medium with which it is possible to realistically prevent a drop in image density, even if exposure is performed using light that has been resolved by a simple, inexpensive device, such as a filter, can be presented.

Moreover, when the half-width of the wavelength absorption peak of each spectral sensitizer is 50 nm or less, it is possible to present an image-forming medium with which crosstalk hardly exists and it is possible to realistically prevent a reduction in image density.

In addition, when the spectral sensitizers having maximum absorption wavelength in the blue, green or red wavelength region are contained in the 3-types of photocuring compositions, it is possible to present an image-forming medium with which full-color printing is possible and it is possible to prevent a reduction in density of the 3 primary colors.

Moreover, when the spectral sensitizers have a maximum absorption wavelength of 400 to 470 nm, 530 to 570 nm, or 630 to 700 nm, respectively, it in possible to present an image-forming medium with which it is possible to reliably prevent a reduction in density of the 3 primary colors.

Furthermore, when the photocuring composition is supported on a substrate in a microcapsule-encapsulated state, it is possible to present an inexpensive image-forming medium with which full-color printing can be performed and a reduction in density of the 3 primary colors, etc., can be prevented.

What is claimed is:

1. An image-forming medium comprising a substrate and at least three photocuring compositions with sensitivity peaks in different wavelength regions supported thereon, wherein each of the at least three photocuring compositions is prepared by mixing as individual components a polymerizable compound, a photoinitiator, an image-forming material and a spectral sensitizer, wherein the spectral sensitizer is designed so that there is apparently no crosstalk in an image which is formed using said image-forming medium, wherein a half-width of a wavelength absorption peak of each spectral sensitizer is 50 nm or less, and wherein the photoinitiator is a metallic arene complex.

2. The image-forming medium according to claim 1, wherein 3 photocuring compositions are supported on the substrate, and each photocuring composition contains a spectral sensitizer having a maximum absorption wavelength in the blue, green or red wavelength region.

3. The image-forming medium according to claim 2, wherein the spectral sensitizer has a maximum absorption wavelength of 400 to 470 nm in the blue region, 530 to 570 nm in the green region, or 630 to 700 nm in the red region.

4. The image-forming medium according to claim 3, the spectral sensitizer having a maximum absorption wavelength of 400 to 470 nm in the blue region is 3-ethyl-5-(1-methylnaphtho[1,2-d]oxazol-2(1H)-ylidene)-2-thioxo-4-thiazolidinone ($\lambda_{max}$=421 nm); 3-ethyl-2-[(3-ethyl-2(3H)-benzothiazolylidene)methyl]benzothiazolium iodide ($\lambda_{max}$=423 nm); 5-chloro-2-[[5-chloro-3-(3-sulfopropyl)-2(3H)-benzothiazolidene]methyl]-3-(3-sulfopropyl)benzothiazolium hydroxide inner salt, sodium salt ($\lambda_{max}$=430 nm); 2-[(1,3-dihydro-1,3,3-trimethyl-2H-indol-2-ylidene)methyl]-1,3,3-trimethyl-3H-indolium perchlorate ($\lambda_{max}$=432 nm); 2,3,6,7-tetrahydro-11-oxo-1H,5H,11H-[1]benzopyrano[6,7,8-ij]quinolidine-10-carboxy acid, ethyl ester ($\lambda_{max}$=438 nm); or 3-ethyl-2-[3-(3-ethyl-2-thiazolidinylidene)-1-propenyl]-4,5-dihydrothiazolium iodide ($\lambda_{max}$=445 nm).

5. The image-forming medium according to claim 3, the spectral sensitizer having a maximum absorption wavelength of 530 to 570 nm in the green region is 9-[2-(ethioxycarbonyl)phenyl]-3,6-bis(ethylamino)-2,7-dimethyl xanthylium chloride ($\lambda_{max}$=530 nm); 3-ethyl-2-[3-(3-ethyl-2(3H)-benzothiazolylidene)-2-methyl-1-propenyl]benzothiazolium iodide ($\lambda_{max}$=543 nm): 9-(2-carboxyphenyl)-3,6-bis(diethylamino)xanthylium chloride ($\lambda_{max}$=546 nm); 3-ethyl-2-[2-[((3-ethyl- 2(3H)-benzothiazolylidene)methyl]-1-butenyl]benzothiazolium iodide ($\lambda_{max}$=547 nm); 5-chloro-2-[3-[5-chloro-3-(3-sulfopropyl)-2(3H)-benzothiazolylidene]-2-methyl-1-propenyl]-3-(3-sulfopropyl)benzothiazolium hydroxide inner salt, triethylamine mixture ($\lambda_{max}$=548 nm); 3,6-bis(diethylamino)-9-(2,4-disulfophenyl)xanthium inner salt ($\lambda_{max}$=554 nm); 3-ethyl-2-[3-(3-ethyl-2(3H)-benzothiazolylidene)-1-propenyl]benzothiazolium iodide ($\lambda_{max}$=557 nm); or 5-chloro-2-[3-[5-chloro-3-(4-sulfobutyl)-2(3H)-benzothiazolylidene]-1propenyl]-3-[4-sulfobutyl)benzothiazolium hydroxide inner salt triethylamine compound ($\lambda_{max}$=566 nm).

6. The image-forming medium according to claim 3, the spectral sensitizer having a maximum absorption wavelength of 630 to 700 nm in the red region is 3-ethyl-2-[5-(3-ethyl-2(3H)-benzothiazolylidene)-1,3-pentadienyl]benzothiazolium iodide ($\lambda_{max}$=652 nm); 2-[[3-[(3-ethyl-2(3H)-benzothiazolylidene)methyl]-5-dimethyl-2-cyclohexane-1-ylidene]methyl]-3-(3-sulfopropyl)benzothiazolium hydroxide inner salt ($\lambda_{max}$=653 nm); 3-ethyl-2-[[3-[(3-ethyl-2(3H)-benzothiazolylidene)methyl]-5,5-dimethyl-2-cyclohexan-1-ylidene]methyl]benzothiazolium iodide ($\lambda_{max}$=653 nm); 1-ethyl-2-[3-(1-ethyl-4(1H)-quinolinylidene)-1-propenyl]quinolinium iodide ($\lambda_{max}$=654 nm); 3-ethyl-2-[[3-ethyl-5-[2-(1-ethyl-4(1H)-quinolinylidene)ethylidene]-4-oxo-2-thiazolidinylidene]methyl]-benzoxazolium bromide ($\lambda_{max}$=660 nm); 3-ethyl-2-[5-[(3-ethyl-2(3H)-benzoselenazolylidene)-1,3-pentadienyl]benzoselenazolium iodide ($\lambda_{max}$=663 nm); 2-[[3-[(5,6-dimethyl-3-phenethyl-2(3H)-benzothiazolylidene)methyl]-5,5-dimethyl-2-cyclohexane-1-ylidene]methyl]-3-(3-sulfopropyl)naphtho[2,1-d]thiazolium hydroxide inner salt ($\lambda_{max}$=676 nm); 3-ethyl-2-[7-(3-ethyl-2(3H)-benzoxazolylidene)-1,3,5-heptatriethyl]benzoxazolium iodide ($\lambda_{max}$=683 nm); 3-ethyl-2-[5-(3-ethylnaphtho[2,1-d]thiazol-2(3H)-ylidene)-1,3-pentadienyl]naphtho[2,1-d]thiazolium iodide ($\lambda_{max}$=686 nm); or 1-ethyl-2-[5-(1-ethylnaphtho[1,2-d]thiazol-2(1H)-ylidene)-1,3-pentadienyl]naphtho[1,2-d]thiazolium iodide ($\lambda_{max}$=689 nm).

7. The image-forming medium according to claim, 2, wherein the spectral sensitizers of each of the photocuring compositions are selected such that a difference between a wavelength on a long wavelength side of the photocuring composition that is photosensitive to blue light where sensitivity is 1/10 a photosensitivity at the maximum absorption wavelength of the photocuring composition photosensitive to blue light and a wavelength on a short wavelength side of a photocuring composition that is photosensitive to green light where sensitivity is 1/10 a photosensitivity at the maximum absorption wavelength of the photocuring composition photosensitive to green light is at least 10 nm or more, and a difference between a wavelength on a long wavelength side of the photocuring composition photosensitive to green light where sensitivity is 1/10 the photosensitivity at the maximum absorption wavelength of the photocuring composition photosensitive to green light and a wavelength on a short wavelength side of a photocuring composition photosensitive to red light where sensitivity is 1/10 a photosensitivity at the maximum absorption wavelength of the photocuring composition photosensitive to red light is at least 10 nm or more.

8. The image-forming medium according to claim 1, wherein the photocuring composition is supported on the substrate in a microcapsule-encapsulated state.

9. The image-forming medium according to claim 1, wherein the metallic arene complex is an iron arene complex.

10. The image-forming medium according to claim 9, wherein the iron arene complex is ($\eta^5$-2,4-cyclopentadien-1-yl)(1,2,3,4,5,6-$\eta$)-(1-methylethyl)benzene}iron(II) hexafluorophosphate.

11. The image-forming medium according to claim 1, wherein there is no crosstalk at 1/1,000 to 1/10,000 a best sensitivity of the spectral sensitizer, based on the sensitivity at the maximum absorption wavelength of the spectral sensitizer.

12. An image-forming medium comprising a substrate and at least three photo-curing compositions with sensitivity peaks in different wavelength regions supported thereon, wherein each of the at least three photo-curing compositions contains a spectral sensitizer that is designed so that there is apparently no cross talk in an image which is formed using said image-forming medium, wherein each of the at least three photo-curing compositions further contains a metallic arene complex as a photoinitiator, and wherein each of the at least three photo-curing compositions is irradiated with light having an energy level such that curing of the photo-curing compositions occurs only at a wavelength region corresponding to a photosensitivity region in which the cross talk is suppressed by the spectral sensitizer.

13. An image-forming medium comprising a substrate and three photocuring compositions with sensitivity peaks in different wavelength regions supported thereon, wherein each of the three photocuring compositions comprises a polymerizable compound, a photoinitiator, an image-forming material and a spectral sensitizer, wherein the photoinitiator is a metallic arene complex, wherein the spectral sensitizer is designed so that there is apparently no crosstalk in an image which is formed using said image-forming medium, each of the three photocuring compositions containing a spectral sensitizer having a maximum absorption wavelength in the blue, green and red wavelength region, respectively, and the spectral sensitizers of each of the photocuring compositions are selected such that a difference between a wavelength on a long wavelength side of the photocuring composition that is photosensitive to blue light where sensitivity is $1/10$ a photosensitivity at the maximum absorption wavelength of the photocuring composition photosensitive to blue light and a wavelength on a short wavelength side of a photocuring composition that is photosensitive to green light where sensitivity is $1/10$ a photosensitivity at the maximum absorption wavelength of the photocuring composition photosensitive to green light is at least 10 nm or more, and a difference between a wavelength on a long wavelength side of the photocuring composition photosensitive to green light where sensitivity is $1/10$ the photosensitivity at the maximum absorption wavelength of the photocuring composition photosensitive to green light and a wavelength on a short wavelength side of a photocuring composition photosensitive to red light where sensitivity is $1/10$ the photosensitivity at the maximum absorption wavelength of the photocuring composition photosensitive to red light is at least 10 nm or more.

14. An image-forming medium comprising a substrate and at least three photocuring compositions with sensitivity peaks in different wavelength regions supported thereon, wherein each of the at least three photocuring compositions comprises a polymerizable compound, a photoinitiator, an image-forming material and a spectral sensitizer, wherein the photoinitiator is a metallic arene complex, and wherein the spectral sensitizer is designed so that there is apparently no crosstalk in an image which is formed using said image-forming medium, and wherein there is no crosstalk at $1/1,000$ to $1/10,000$ a best sensitivity of the spectral sensitizer, based on the sensitivity at a maximum absorption wavelength of the spectral sensitizer.

15. An image-forming medium comprising a substrate and at least three photocuring compositions with sensitivity peaks in different wavelength regions supported thereon, wherein each of the at least three photocuring compositions comprises a polymerizable compound, a photoinitiator, an image-forming material and a spectral sensitizer, wherein the photoinitiator is a metallic arene complex, wherein the spectral sensitizer is designed so that there is apparently no crosstalk in an image which is formed using said image-forming medium, wherein a half-width of a wavelength absorption peak of each spectral sensitizer is 50 nm or less, wherein each photocuring composition contains a spectral sensitizer having a maximum absorption wavelength in the blue, green or red wavelength region, and wherein the spectral sensitizer having a maximum absorption wavelength of 400 to 470 nm in the blue region is at least one material selected from the group consisting of 3-ethyl-5-(1-methylnaphtho{1,2-d}oxazol-2(1H)-ylidene)-2-thioxo-4-thiazolidinone ($\lambda_{max}$=421 nm), 3-ethyl-2-{(3-ethyl-2(3H)-benzothiazolylidene)methyl}benzothiazolium iodide ($\lambda$=423 nm), 5-chloro-2-{{5-chloro-3-(3-sulfopropyl)-2(3H)-benzothiazolidene}methyl}-3-(3-sulfopropyl)benzothiazolium hydroxide inner salt, sodium salt ($\lambda_{max}$=430 nm), 2-{(1,3-dihydro-1,3,3-trimethyl-2H-indol-2-ylidene)methyl}-1,3,3-trimethyl-3H-indolium perchlorate ($\lambda_{max}$=432 nm), 2,3,6,7-tetrahydro-11-oxo-1H,5H,11H-{1}benzopyrano{6,7,8-ij}quinolidine-10-carboxy acid, ethyl ester ($\lambda_{max}$=438 nm), and 3-ethyl-2-{3-(3-ethyl-2-thiazolidinylidene)-1-propenyl}-4,5-dihydrothiazolium iodide ($\lambda_{max}$=445 nm).

16. An image-forming medium comprising a substrate and at least three photocuring compositions with sensitivity peaks in different wavelength regions supported thereon, wherein each of the at least three photocuring compositions comprises a polymerizable compound, a photoinitiator, an image-forming material and a spectral sensitizer, wherein the photoinitiator is a metallic arene complex, wherein the spectral sensitizer is designed so that there is apparently no crosstalk in an image which is formed using said image-forming medium, wherein a half-width of a wavelength absorption peak of each spectral sensitizer is 50 nm or less, wherein each photocuring composition contains a spectral sensitizer having a maximum absorption wavelength in the blue, green or red wavelength region, and wherein the spectral sensitizer having a maximum absorption wavelength of 530 to 570 nm in the green region is at least one material selected from the group consisting of 9-{2-(ethioxycarbonyl)phenyl}-3,6-bis(ethylamino)-2,7-dimethyl xanthylium chloride ($\lambda_{max}$=530 nm); 3-ethyl-2-{3-(3-ethyl-2(3H)-benzothiazolylidene)-2-methyl-1-propenyl}benzothiazolium iodide ($\lambda_{max}$=543 nm); 9-(2-carboxyphenyl)-3,6-bis(diethylamino)xanthylium chloride ($\lambda_{max}$=546 nm); 3-ethyl-2-{2-{(3-ethyl-2-(3H)-benzothiazolylidene methyl}-1-butenyl}benzothiazolium iodide ($\lambda_{max}$=547 nm); 5-chloro-2-{3-(5-chloro-3-(3-sulfopropyl)-2(3H)-benzothiazolylidene}-2-methyl-1-propenyl}-3-(3-sulfopropyl)benzothiazolium hydroxide inner salt, triethylamine mixture ($\lambda_{max}$=548 nm); 3,6-bis (diethylamino)-9-(2,4-disulfophenyl)xanthium inner salt ($\lambda_{max}$=554 nm); 3-ethyl-2-{3-(3-ethyl-2(3H)-benzothiazolylidene)-1-propenyl}benzothiazolium iodide ($\lambda_{max}$=557 nm); and 5-chloro-2-{3-{5-chloro-3-(4-sulfobutyl)-2(3H)-benzothiazolylidene}-1-propenyl}-3-(4-sulfobutyl)benzothiazolium hydroxide inner salt triethylamine compound ($\lambda_{max}$=566 nm).

17. An image-forming medium comprising a substrate and at least three photocuring compositions with sensitivity peaks in different wavelength regions supported thereon, wherein each of the at least three photocuring compositions comprises a polymerizable compound, a photoinitiator, an image-forming material and a spectral sensitizer, wherein the photoinitiator is a metallic arene complex, wherein the spectral sensitizer is designed so that there is apparently no crosstalk in an image which is formed using said image-forming medium, wherein a half-width of a wavelength absorption peak of each spectral sensitizer is 50 nm or less, wherein each photocuring composition contains a spectral sensitizer having a maximum absorption wavelength in the blue, green or red wavelength region, and wherein the spectral sensitizer having a maximum absorption wavelength of 630 to 700 nm in the red region is at least one material selected from the group consisting of 3-ethyl-2-{5-(3-ethyl-2(3H)-benzothiazolylidene)-1,3-pentadienyl} benzothiazolium iodide ($\lambda_{max}$=652 nm); 2-{{3-{(3-ethyl-2(3H-)benzothiazolylidene)methyl}-5-dimethyl-2-cyclohexan-1-ylidene}methyl}-3-(3 sulfopropyl)benzothiazolium hydroxide inner salt ($\lambda_{max}$=653 nm); 3-ethyl-2-{{3-{(3-ethyl2(3H)-benzothiazolylidene)methyl}-5,5-dimethyl-2-cyclohexan-1-ylidene}methyl}benzothiazolium iodide ($\lambda_{max}$=653 nm); 1-ethyl-2-{3-(1-ethyl-4(1H)-quinolinylidene)-1-propenyl}quinolinium iodide ($\lambda_{max}$=654 nm); 3-ethyl-2-{{3-ethyl-5-{2-(1-ethyl-4(1H)-quinolinylidene)ethylidene}-4-oxo-2-thiazolidinylidene}methyl}-benzoxazolium bromide ($\lambda_{max}$=660 nm); 3-ethyl-2-{5-{(3-ethyl-2(3H)-benzoselenazolylidene)-1,3-pentadienyl}benzoselenasolium iodide ($\lambda_{max}$=663 nm); 2-{{3-{(5,6-dimethyl-3-phenethyl-2(3H)-benzothiazolylidene)methyl)-5,5-dimethyl-2-cyclohexane-1-ylidene}methyl}-3-(3-sulfopropyl)naphtho{2,1-d}thiazolium hydroxide inner salt ($\lambda_{max}$=676 nm); 3-ethyl-2-{7-(3-ethyl-2(3H)-benzoxazolylidene)-1,3,5-heptatriethyl}benzoxazolium iodide ($\lambda_{max}$=683 nm); 3-ethyl-2-{5-(3-ethylnaphtho{2,1-d}thiazol-2(3H)-ylidene)-1,3-pentadienyl}naphtho{2,1-d}thiazolium iodide ($\lambda_{max}$=686 nm); and 1-ethyl-2-{5-(1-ethylnaphtho{1,2-d}thiazol-2(1H)-ylidene)-1,3-pentadienyl}naphtho{1,2-d}thiazol iodide ($\lambda_{max}$=689 nm).

18. An image-forming medium comprising a substrate and at least three photocuring compositions with sensitivity peaks in different wavelength regions supported thereon, wherein each of the at least three photocuring compositions comprises a polymerizable compound, a photoinitiator, an image-forming material and a spectral sensitizer, wherein the photoinitiator is a metallic arene complex, wherein the spectral sensitizer is designed so that there is apparently no crosstalk in an image which is formed using said image-forming medium, wherein a half-width of a wavelength absorption peak of each spectral sensitizer is 50 nm or less, wherein each photocuring composition contains a spectral sensitizer having a maximum absorption wavelength in the blue, green or red wavelength region, and wherein the spectral sensitizer having a maximum absorption wavelength of 400 to 470 nm in the blue region is at least one material selected from the group consisting of 3-ethyl-5-(1-methylnaphtho{1,2-d}oxazol-2(1H)-ylidene)-2-thioxo-4-thiazolidinone ($\lambda_{max}$=421 nm), 3-ethyl-2-{(3-ethyl-2(3H)-benzothiazolylidene) methyl}benzothiazolium iodide ($\lambda_{max}$=423 nm), 5-chloro-2-{{5-chloro-3-(3-sulfopropyl)-2(3H)-benzothiazolidene}methyl}-3-(3-sulfopropyl) benzothiazolium hydroxide inner salt, sodium salt ($\lambda_{max}$=430 nm), 2-{(1,3-dihydro-1,3,3-trimethyl-2H-indol-2-ylidene)methyl}-1,3,3-trimethyl-3H-indolium perchlorate ($\lambda_{max}$=432 nm), 2,3,6,7-tetrahydro-11-oxo-1H,5H,11H-{1}benzopyrano{6,7,8-ij}quinolidine-10-carboxy acid, ethyl ester ($\lambda_{max}$=438 nm), and 3-ethyl-2-{3-(3-ethyl-2-thiazolidinylidene)-1-propenyl}-4,5-dihydrothiazolium iodide ($\lambda_{max}$=445 nm), the spectral sensitizer having a maximum absorption wavelength of 530 to 570 nm in the green region is at least one material selected from the group consisting of 9-{2-(ethioxycarbonyl)phenyl}-3,6-bis(ethylamino)-2,7-dimethyl xanthylium chloride ($\lambda_{max}$=530 nm); 3-ethyl-2-{3-(3-ethyl-2(3H)-benzothiazolylidene)-2-methyl-1-propenyl}benzothiazolium iodide ($\lambda_{max}$=543 nm); 9-(2-carboxyphenyl)-3,6-bis(diethylamino) xanthylium chloride ($\lambda_{max}$=546 nm); 3-ethyl-2-{2-{(3-ethyl-2-(3H)-benzothiazolylidene methyl}-1-butenyl}benzothiazolium iodide ($\lambda_{max}$=547 nm); 5-chloro-2-{3-(5-chloro-3-(3-sulfopropyl)-2(3H)-benzothiazolylidene}-2-methyl-1-propenyl}-3-(3-sulfopropyl)benzothiazolium hydroxide inner salt, triethylamine mixture ($\lambda_{max}$=548 nm); 3,6-bis (diethylamino)-9-(2,4-disulfophenyl)xanthium inner salt ($\lambda_{max}$=554 nm); 3-ethyl-2-{3-(3-ethyl-2(3H)-benzothiazolylidene)-[1]-propenyl}benzothiazolium iodide ($\lambda_{max}$=557 nm); and 5-chloro-2-{3-{5-chloro-3-(4-sulfobutyl)-2(3H)-benzothiazolylidene}-1-propenyl}-3-(4-sulfobutyl)benzothiazolium hydroxide inner salt triethylamine compound ($\lambda_{max}$=566 nm), and the spectral sensitizer having a maximum absorption wavelength of 630 to 700 nm in the red region is at least one material selected from the group consisting of 3-ethyl-2-{5-(3-ethyl-2(3H)-benzothiazolylidene)-1,3-pentadienyl}benzothiazolium iodide ($\lambda_{max}$=652 nm); 2-{{3-{(3-ethyl-2(3H)-benzothiazolylidene)methyl}-5-dimethyl-2-cyclohexan-1-ylidene}methyl}-3-(3-sulfopropyl)benzothiazolium hydroxide inner salt ($\lambda_{max}$=653 nm); 3-ethyl-2-{{3-{(3-ethyl-2(3H)-benzothiazolylidene)methyl}-5,5-dimethyl-2-cyclohexan-1-ylidene}methyl}benzothiazolium iodide ($\lambda_{max}$=653 nm); 1-ethyl-2-{3-(1-ethyl-4(1H)-quinolinylidene)-1-propenyl}quinolinium iodide ($\lambda_{max}$=654 nm); 3-ethyl-2-{{3-ethyl-5-{2-(1-ethyl-4(1H)-quinolinylidene)ethylidene}-4-oxo-2-thiazolidinylidene}methyl}-benzoxazolium bromide ($\lambda_{max}$=660 nm); 3-ethyl-2-{5-{(3-ethyl-2(3H)-benzoselenazolylidene)-1,3-pentadienyl}benzoselenasolium iodide ($\lambda_{max}$=663 nm); 2-{{3-{(5,6-dimethyl-3-phenethyl-2(3H)-benzothiazolylidene)methyl)-5,5-dimethyl-2-cyclohexane-1-ylidene}methyl}-3-(3-sulfopropyl) naphtho{2,1-d}thiazolium hydroxide inner sally ($\lambda_{max}$=676 nm); 3-ethyl-2-{7-(3-ethyl-2(3H)-benzoxazolylidene)-1,3,5-heptatriethyl}benzoxazolium iodide ($\lambda_{max}$=683 nm); 3-ethyl-2-{5-(3-ethylnaphtho{2,1-d}thiazol-2(3H)-ylidene)-1,3-pentadienyl}naphtho{2,1-d}thiazolium iodide ($\lambda_{max}$=686 nm); and 1-ethyl-2-{5-(1-ethylnaphtho {1,2-d}thiazol-2(1H)-ylidene)-1,3-pentadienyl}naphtho{1,2-d}thiazolium iodide ($\lambda_{max}$=689 nm).

* * * * *